(12) United States Patent
Gu et al.

(10) Patent No.: US 9,276,199 B2
(45) Date of Patent: *Mar. 1, 2016

(54) SMALL FORM FACTOR MAGNETIC SHIELD FOR MAGNETORESTRICTIVE RANDOM ACCESS MEMORY (MRAM)

(71) Applicant: QUALCOMM Incorporated, San Diego, CA (US)

(72) Inventors: Shiqun Gu, San Diego, CA (US); Rongtian Zhang, San Diego, CA (US); Vidhya Ramachandran, San Diego, CA (US); Dong Wook Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/499,027

(22) Filed: Sep. 26, 2014

(65) Prior Publication Data

US 2015/0048465 A1  Feb. 19, 2015

Related U.S. Application Data

(63) Continuation of application No. 13/777,475, filed on Feb. 26, 2013, now Pat. No. 8,952,504.

(60) Provisional application No. 61/762,428, filed on Feb. 8, 2013.

(51) Int. Cl.
*H01L 23/552* (2006.01)
*H01L 43/12* (2006.01)
(Continued)

(52) U.S. Cl.
CPC .............. *H01L 43/12* (2013.01); *H01L 23/552* (2013.01); *H01L 23/645* (2013.01); *H01L 27/222* (2013.01); *H01L 27/228* (2013.01); *H01L 43/02* (2013.01); *H01L 2924/0002* (2013.01)

(58) Field of Classification Search
CPC .............. H01L 2924/3025; H01L 2225/06537
USPC .................. 257/294, 295, 659, 660, E21.208, 257/E21.663, E29.164
See application file for complete search history.

(56) References Cited

U.S. PATENT DOCUMENTS

| 6,888,184 B1 | 5/2005 | Shi et al. |
|---|---|---|
| 7,166,479 B2 | 1/2007 | Zhu et al. |

(Continued)

OTHER PUBLICATIONS

International Search Report and Written Opinion—PCT/US2014/014214—ISA/EPO—Aug. 12, 2014.

(Continued)

*Primary Examiner* — Hoai V Pham
(74) *Attorney, Agent, or Firm* — Loza & Loza, LLP

(57) ABSTRACT

Some implementations provide a die that includes a magnetoresistive random access memory (MRAM) cell array that includes several MRAM cells. The die also includes a first ferromagnetic layer positioned above the MRAM cell array, a second ferromagnetic layer positioned below the MRAM cell array, and several vias positioned around at least one MRAM cell. The via comprising a ferromagnetic material. In some implementations, the first ferromagnetic layer, the second ferromagnetic layer and the several vias define a magnetic shield for the MRAM cell array. The MRAM cell may include a magnetic tunnel junction (MTJ). In some implementations, the several vias traverse at least a metal layer and a dielectric layer of the die. In some implementations, the vias are through substrate vias. In some implementations, the ferromagnetic material has high permeability and high B saturation.

47 Claims, 18 Drawing Sheets

(51) Int. Cl.
*H01L 43/02* (2006.01)
*H01L 23/64* (2006.01)
*H01L 27/22* (2006.01)

(56) References Cited

U.S. PATENT DOCUMENTS

| | | |
|---|---|---|
| 7,772,679 B2 | 8/2010 | Chang et al. |
| 7,795,708 B2 | 9/2010 | Katti |
| 2004/0222511 A1 | 11/2004 | Zhang |
| 2008/0122047 A1* | 5/2008 | Honer et al. ............ 257/660 |
| 2009/0178833 A1 | 7/2009 | Lu |
| 2010/0270660 A1 | 10/2010 | Masuda et al. |
| 2012/0205764 A1 | 8/2012 | Chen et al. |
| 2014/0225208 A1 | 8/2014 | Gu et al. |

OTHER PUBLICATIONS

Partial International Search Report—PCT/US2014/014214—ISA/EPO—Jun. 10, 2014.

Yu, "Integration of Magnetic Materials into on-Chip Inductor for RF Applications", Ira A. Fulton Schools of Engineering, Arizona State University, 2012, 19pgs.

* cited by examiner

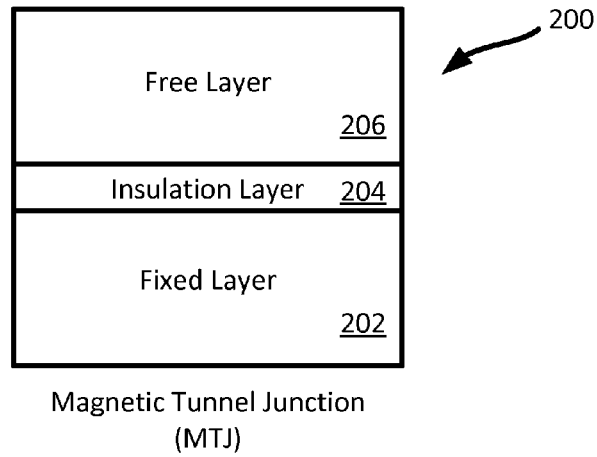
Magnetic Tunnel Junction (MTJ)
FIG. 2
*(Prior Art)*
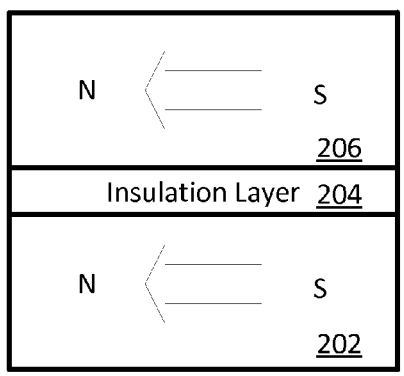 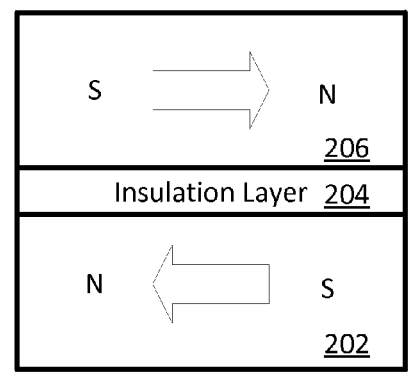
Magnetic Tunnel Junction (MTJ)
Low Resistance
Magnetic Tunnel Junction (MTJ)
High Resistance
FIG. 3A
*(Prior Art)*
FIG. 3B
*(Prior Art)*

Magnetic Tunnel Junction
(MTJ)

Low Resistance

Magnetic Tunnel Junction
(MTJ)

High Resistance

SMALL FORM FACTOR MAGNETIC SHIELD FOR MAGNETORESTRICTIVE RANDOM ACCESS MEMORY (MRAM)

The present application claims priority to U.S. patent application Ser. No. 13/777,475 titled "Small Form Factor Magnetic Shield for Magnetorestrictive Random Access Memory (MRAM)", filed Feb. 26, 2013. U.S. patent application Ser. No. 13/777,475 claims priority to U.S. Provisional Application No. 61/762,428 entitled "Small form factor magnetic shield for magnetorestrictive random access memory (MRAM)", filed Feb. 8, 2013. Both applications are hereby expressly incorporated by reference herein.

BACKGROUND

1. Field

Various features relate to a small form factor magnetic shield for magnetorestrictive random access memory (MRAM).

2. Background

Magnetoresistive random access memory (MRAM) is a memory technology that stores data using magnetic storage elements and/or cells. FIG. 1 conceptually illustrates a die/wafer that includes an MRAM cell array for storing data. Specifically, FIG. 1 conceptually illustrates a die 100 that includes a substrate 102, several metal and dielectric layers 104 and a MRAM cell array 106. The MRAM cell array 106 includes several MRAM cells 106a-f. Each of these cells includes a magnetic tunnel junction (MTJ). The MTJ is what allows the MRAM to store data.

FIG. 2 illustrates a magnetic tunnel junction (MTJ) 200 of at least one of the cells of FIG. 1. As shown in FIG. 2, the MTJ 200 includes a fixed magnetic layer 202, an insulation layer 204, and a free magnetic layer 206. The magnetic layers 202 and 206 are ferromagnetic layers and the insulation layer 204 is a dielectric layer. Each magnetic layer 202 and 206 has a polarity (a north pole and a south pole). The fixed magnetic layer 202 is fixed because the polarity of the magnetic layer 202 cannot be changed. The free magnetic layer 206 is free because the polarity of the magnetic layer 206 can be changed (the poles can be changed). As mentioned above, the MTJ 200 is what allows the MRAM 200 to store data. The MTJ 200 can have two states. In one state, the free magnetic layer 206 is polarized in the same direction as the fixed magnetic layer 202. In another state, the free magnetic layer 206 is polarized in the opposite direction of the fixed magnetic layer 202.

As described above, the MTJ 200 may be in two possible states, a low resistance state and a high resistance state, which are illustrated in FIGS. 3A-3B and 4A-4B. FIG. 3A illustrates the MTJ 200 in a low resistance state. As shown in FIG. 3A, in a low resistance state, the polarities of magnetic layers 202 and 206 of the MTJ 200 are aligned (the north and south poles of the magnetic layers are on the same side). FIG. 3B illustrates the MTJ 200 in a high resistance state. As shown in FIG. 3B, in a high resistance state, the polarities of the magnetic layers 202 and 206 of the MTJ 200 are opposite to each other (the north pole of the one the magnetic layer is on the opposite side of the north pole of the other magnetic layer).

FIGS. 3A-3B show that the difference between the two states of the MTJ 200 is the polarity of free magnetic layer 206. The difference between the two states of the MTJ 200 may be expressed by the resistance of the MTJ 200 to a current. When the polarities of the two magnetic layers 202 and 206 are aligned, as shown in FIG. 3, the resistance of the MTJ 200 is low. In contrast, when the polarities of the two magnetic layers 202 and 206 are opposite to each other, the resistance of the MTJ 200 is high (relative to the resistance of the MTJ 200 when the polarities of the magnetic layers are aligned). In other words, the resistance of the MTJ 200 is higher when the polarities of the magnetic layers are opposite to each other then when the polarities of the magnetic layer are aligned. These low and high resistance states may correspond to the binary memory states of 0 and 1.

FIGS. 3A-3B illustrates parallel MTJs. However, in some implementations, an MTJ may also be a perpendicular MTJ, as illustrated in FIGS. 4A-4B. As shown in FIG. 4A, in a low resistance state, the polarities of magnetic layers 202 and 206 of the MTJ 200 are aligned in the same direction (the north and south poles of the magnetic layers are in the same direction). FIG. 4B illustrates the MTJ 200 in a high resistance state. As shown in FIG. 4B, in a high resistance state, the polarities of the magnetic layers 202 and 206 of the MTJ 200 are aligned in opposite directions.

As mentioned above, the polarity of a free magnetic layer may be switched. In one instance, the polarity of the free magnetic layer is switched by applying a sufficiently large current through the MTJ. Applying a current in the opposite direction through the MTJ will switch the polarity of the free magnetic layer back. In the case of a STT-MRAM, a spin polarized current may be applied to the MTJ to switch the polarity of the free magnetic layer. A spin polarized current is a current that includes electrons that spin in one direction more than in the other direction (more than 50% spin-up or spin-down). A current is typically unpolarized, but can be made a spin polarized current by passing the current through a magnetic layer.

In another instance, applying a sufficiently large magnetic field will also switch the polarity of the free magnetic layer. Similarly, applying a sufficiently large magnetic field in the opposite direction will switch the polarity of the free magnetic layer back. Thus, in addition to current, magnetic field properties must be taken into account when designing and testing MTJs or any memory that uses MTJs, such as an MRAM. Each cell (i.e., each MTJ) of an MRAM may have different properties (e.g., magnetic properties). That is, each cell may switch back and forth between states under different magnetic field strengths.

One major drawback of an MRAM is that a sufficiently large magnetic field may switch the state of the cells of the MRAM, thereby causing the wrong state to be stored in some or all of the cells in the MRAM. Therefore, there is a need for a method and structure to prevent magnetic fields from affecting the MRAM. More specifically, there is a need for a method and structure to prevent magnetic fields from switching the states of cells of an MRAM. Ideally, any such structure will have a small form factor.

SUMMARY

Various features, apparatus and methods described herein provide a small form factor magnetic shield for magnetorestrictive random access memory (MRAM).

A first example provides a die that includes a component, a first ferromagnetic layer positioned above the component and a second ferromagnetic layer positioned below the component. The die also includes several through substrate vias positioned around the component. The through substrate via includes a ferromagnetic material.

According to one aspect, the component is sensitive to a magnetic field. In some implementations, the component is one of a transformer, a magnetoresistive random access (MRAM) cell, and/or a component comprising a magnetic material.

According to an aspect, the first ferromagnetic layer, the second ferromagnetic layer and the several through substrate vias define a magnetic shield for the component.

According to one aspect, the component is a magnetoresistive random access memory (MRAM) cell array that includes several MRAM cells. In some implementations, the several through substrate vias are positioned laterally with respect to at least one MRAM cell. In some implementations, the first ferromagnetic layer is a thin film layer coated on a front portion of the die. In some implementations, the second ferromagnetic layer is a thin film layer coated on a back portion of the die. The several through substrate vias are coupled to the first and second ferromagnetic layers. In some implementations, the magnetoresistive random access (MRAM) cell includes a magnetic tunnel junction (MTJ). The ferromagnetic material has high permeability and high B saturation in some implementations. The substrate includes a material made of one of silicon, glass and/or sapphire.

According to one aspect, the die is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a method for providing a die that includes a magnetic shield. The method provides a die that includes a component. The method provides a first ferromagnetic layer positioned above the component. The method provides a second ferromagnetic layer positioned below the component. The method provides several through substrate vias positioned around the component. The through substrate via includes a ferromagnetic material.

According to one aspect, the component is sensitive to a magnetic field. In some implementations, the component is one of a transformer, a magnetoresistive random access (MRAM) cell, and/or a component comprising a magnetic material.

According to an aspect, the first ferromagnetic layer, the second ferromagnetic layer and the several through substrate vias define a magnetic shield for the component.

According to one aspect, the component is a magnetoresistive random access memory (MRAM) cell array that includes several MRAM cells. In some implementations, the several through substrate vias are positioned laterally with respect to at least one MRAM cell. In some implementations, the first ferromagnetic layer is a thin film layer coated on a front portion of the die. In some implementations, the second ferromagnetic layer is a thin film layer coated on a back portion of the die. The several through substrate vias are coupled to the first and second ferromagnetic layers. In some implementations, the magnetoresistive random access (MRAM) cell includes a magnetic tunnel junction (MTJ). The ferromagnetic material has high permeability and high B saturation in some implementations. The substrate includes a material made of one of silicon, glass and/or sapphire.

According to an aspect, providing the several through substrate vias includes manufacturing several cavities that traverse a metal layer, a dielectric layer, and a substrate of the die. In some implementations, providing the several through substrate vias also includes filling the cavities with a ferromagnetic material to form the several through substrate vias.

A third example provides a die that includes a component, a first shielding means configured to provide shielding of the component from a top magnetic field traversing a top portion of the die, a second shielding means configured to provide shielding of the component from a bottom magnetic field traversing a bottom portion of the die, and a third shielding means configured to provide shielding of the component from a side magnetic field traversing a side portion of the die.

According to one aspect, the component is sensitive to a magnetic field. In some implementations, the component is one of a transformer, a magnetoresistive random access (MRAM) cell, and/or a component comprising a magnetic material.

According to an aspect, the first shielding means includes a first ferromagnetic layer positioned above the component. In some implementations, the first ferromagnetic layer is a thin film layer coated on a front portion of the die.

According to one aspect, the second shielding means includes a second ferromagnetic layer positioned below the component. In some implementations, the second ferromagnetic layer is a thin film layer coated on a back portion of the die.

According to another aspect, the third shielding means includes several through substrate vias positioned around at least one component. The via includes a ferromagnetic material. In some implementations, the ferromagnetic material has high permeability and high B saturation in some implementations. The substrate includes a material made of one of silicon, glass and/or sapphire.

According to one aspect, the die is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides a die package that includes a packaging substrate, a die coupled to the packaging substrate, a first ferromagnetic layer below the die, and a second ferromagnetic layer above the die. The die package also includes a molding surrounding the die, and several vias positioned around an outer perimeter of the die. The several vias formed in at least the molding. The via includes a ferromagnetic material.

According to one aspect, the die includes a component that is sensitive to a magnetic field. In some implementations, the component is one of a transformer, a magnetoresistive random access (MRAM) cell, and/or a component comprising a magnetic material.

According to an aspect, the first ferromagnetic layer, the second ferromagnetic layer and the several vias define a magnetic shield for the die. In some implementations, the second ferromagnetic layer forms the enclosure of the die package. In some implementations, the second ferromagnetic layer is a ferromagnetic film layer. In some implementations, the ferromagnetic material has high permeability and high B saturation.

According to one aspect, the die includes a magnetoresistive random access memory (MRAM) cell array that includes several MRAM cells. The MRAM cell includes a magnetic tunnel junction (MTJ).

According to an aspect, the die package is incorporated into at least one of a music player, a video player, an entertainment unit, a navigation device, a communications device, a mobile phone, a smartphone, a personal digital assistant, a fixed location terminal, a tablet computer, and/or a laptop computer.

A fifth example provides a method for providing a die package that includes a magnetic shield. The method provides a packaging substrate. The method provides a die coupled to the packaging substrate. The method provides a first ferromagnetic layer below the die. The method provides a second ferromagnetic layer above the die. The method provides a molding surrounding the die. The method provides several vias positioned around an outer perimeter of the die. The several vias formed in at least the molding. The via includes a ferromagnetic material.

According to one aspect, the die includes a component that is sensitive to a magnetic field. In some implementations, the component is one of a transformer, a magnetoresistive random access (MRAM) cell, and/or a component comprising a magnetic material.

According to an aspect, the first ferromagnetic layer, the second ferromagnetic layer and the several vias define the magnetic shield for the die. In some implementations, the second ferromagnetic layer forms the enclosure of the die package. In some implementations, the second ferromagnetic layer is a ferromagnetic film layer. In some implementations, the ferromagnetic material has high permeability and high B saturation.

According to one aspect, the die includes a magnetoresistive random access memory (MRAM) cell array that includes several MRAM cells. The MRAM cell includes a magnetic tunnel junction (MTJ).

According to an aspect, providing the several vias includes manufacturing several cavities that traverse the molding of the die package. In some implementations, providing the several vias also includes filling the cavities with a ferromagnetic material to form the several vias.

According to one aspect, the die package is incorporated into at least one of a music player, a video player, an entertainment unit, a navigation device, a communications device, a mobile phone, a smartphone, a personal digital assistant, a fixed location terminal, a tablet computer, and/or a laptop computer.

A sixth example provides a die package that includes a packaging substrate, a die coupled to the packaging substrate, and a molding surrounding the die. The die package also includes a first shielding means configured to provide shielding of the die from a bottom magnetic field traversing a bottom portion of the die package. The die package also includes a second shielding means configured to provide shielding of the die from a top magnetic field traversing a top portion of the die package. The die package also includes a third shielding means configured to provide shielding of the die from a side magnetic field traversing a side portion of the die package.

According to one aspect, the die includes a component that is sensitive to a magnetic field. In some implementations, the component is one of a transformer, a magnetoresistive random access (MRAM) cell, and/or a component comprising a magnetic material.

According to an aspect, the first shielding means includes a first ferromagnetic layer below the die. In some implementations, the second shielding means includes a second ferromagnetic layer above the die.

According to one aspect, the third shielding means includes several vias positioned around an outer perimeter of the die. The several vias formed in at least the molding. The via includes a ferromagnetic material. In some implementations, the ferromagnetic material has high permeability and high B saturation.

According to one aspect, the die includes a magnetoresistive random access memory (MRAM) cell array that includes several MRAM cells. The MRAM cell includes a magnetic tunnel junction (MTJ).

According to one aspect, the bottom magnetic field, the top magnetic field and the side magnetic field originate from at least a same magnetic field.

According to one aspect, the die package is incorporated into at least one of a music player, a video player, an entertainment unit, a navigation device, a communications device, a mobile phone, a smartphone, a personal digital assistant, a fixed location terminal, a tablet computer, and/or a laptop computer.

A seventh example provides a die that includes a magnetoresistive random access memory (MRAM) cell array including several MRAM cells. The die also includes a first ferromagnetic layer positioned above the MRAM cell array and a second ferromagnetic layer positioned below the MRAM cell array. The die further includes several vias positioned around at least one MRAM cell. The via includes a ferromagnetic material. In some implementations, the vias are through substrate vias.

An eighth example provides a die package that includes a packaging substrate and a die that includes a magnetoresistive random access memory (MRAM) cell array. The (MRAM) cell array includes several MRAM cells. The die is coupled to the packaging substrate. The die package also includes a first ferromagnetic layer below the die and a second ferromagnetic layer above the die. The die package also includes a molding surrounding the die and several vias positioned around an outer perimeter of the die. The several vias are formed in at least the molding. The via includes a ferromagnetic material.

DRAWINGS

Various features, nature and advantages may become apparent from the detailed description set forth below when taken in conjunction with the drawings in which like reference characters identify correspondingly throughout.

FIG. 2 illustrates a magnetic tunnel junction (MTJ) of a cell.

FIG. 3A illustrates a magnetic tunnel junction (MTJ) under low resistance.

FIG. 3B illustrates a magnetic tunnel junction (MTJ) under high resistance.

Figure 9A:
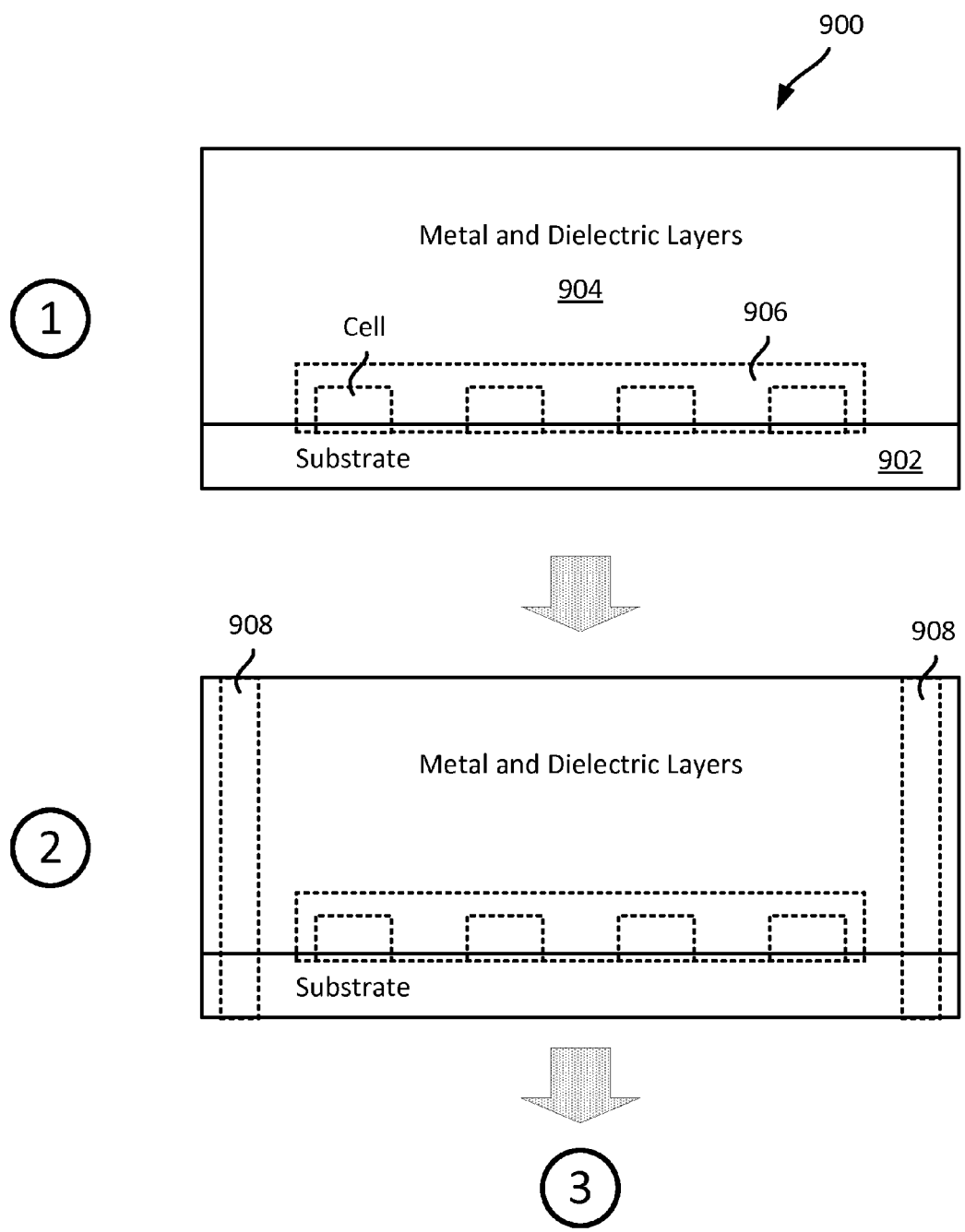
Figure 9B:
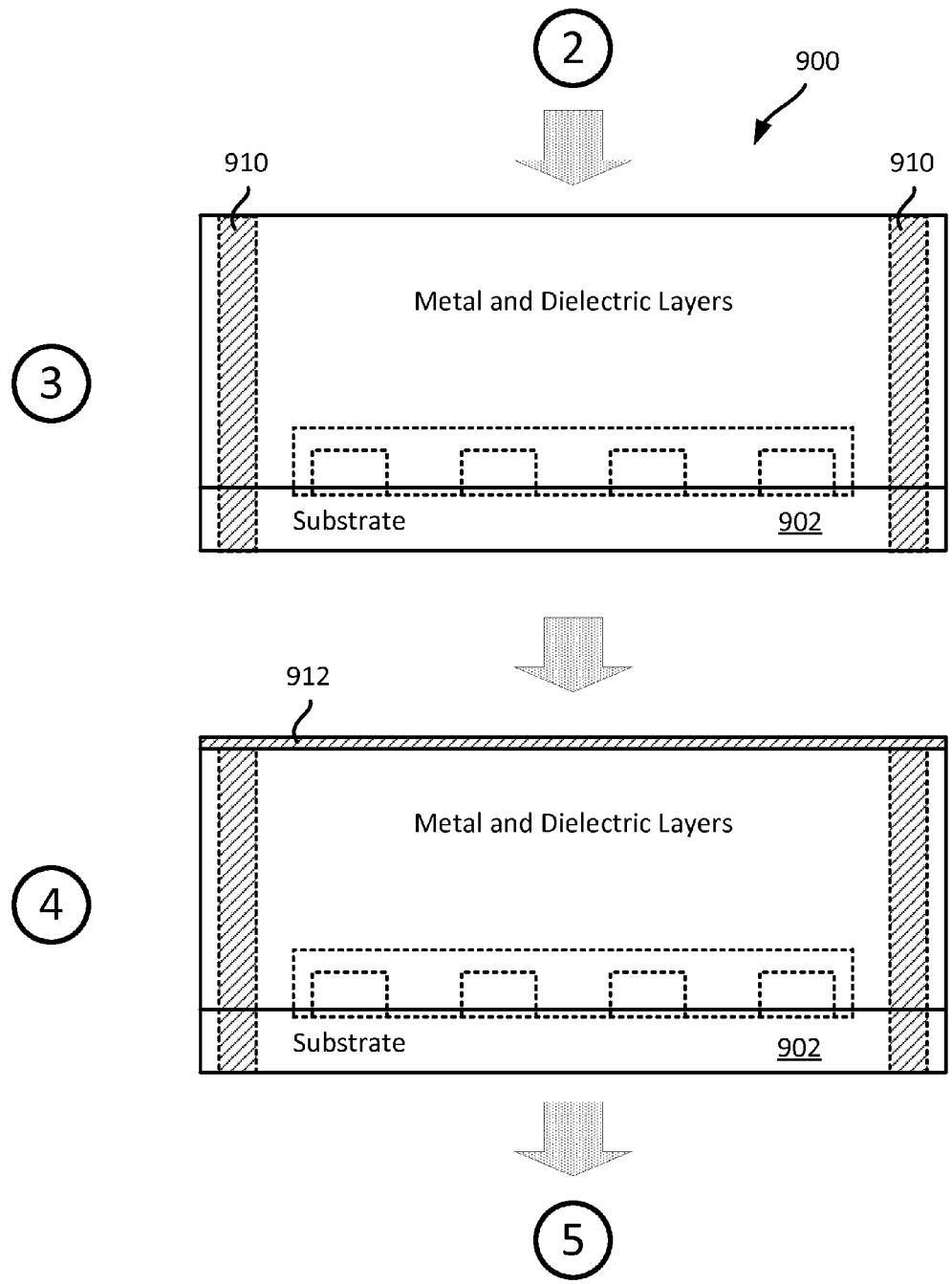
Figure 9C:
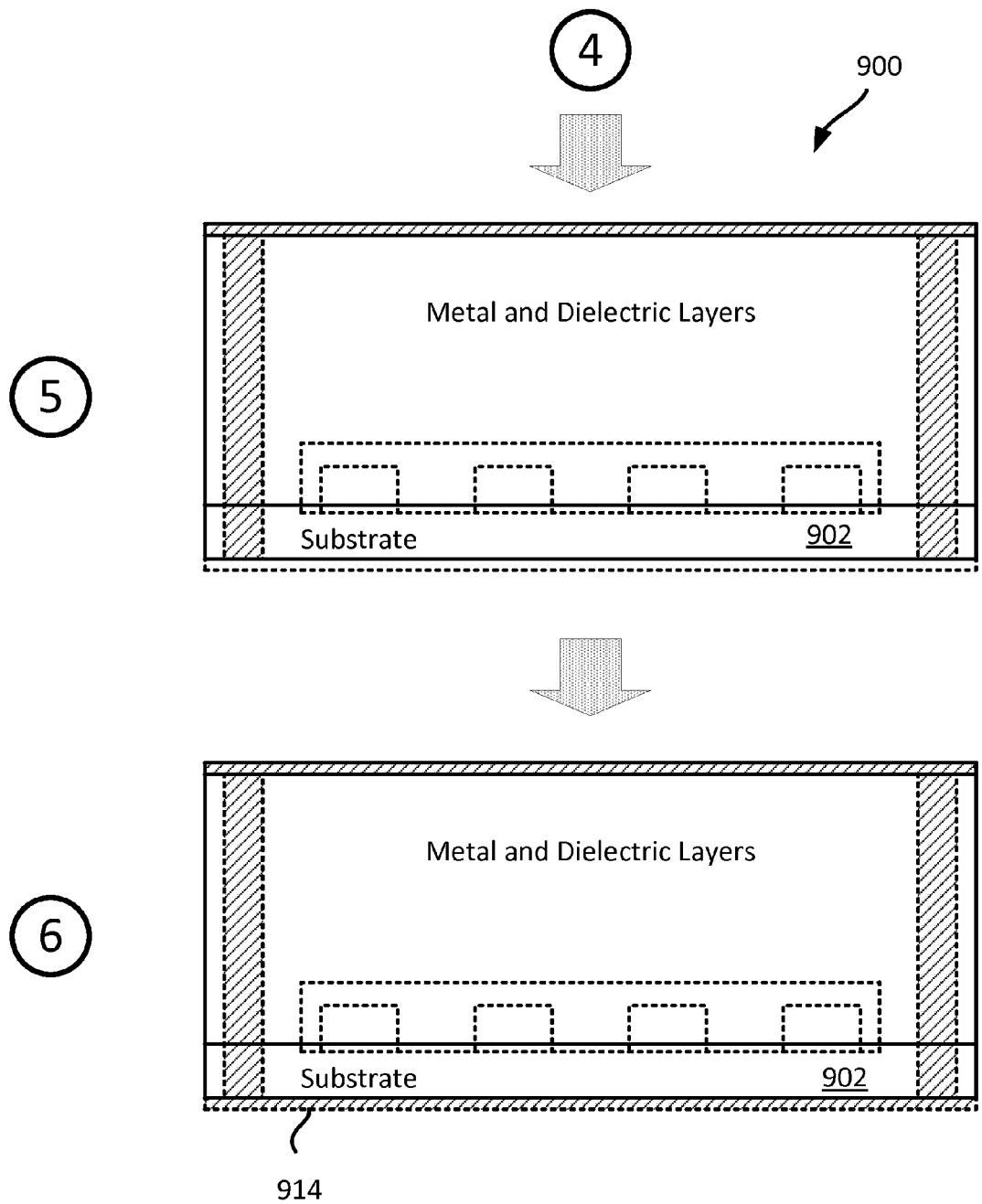

FIGS. 9A-C illustrate a sequence of a method for manufacturing a die that includes an MRAM cell array and magnetic shielding.

Figure 10:
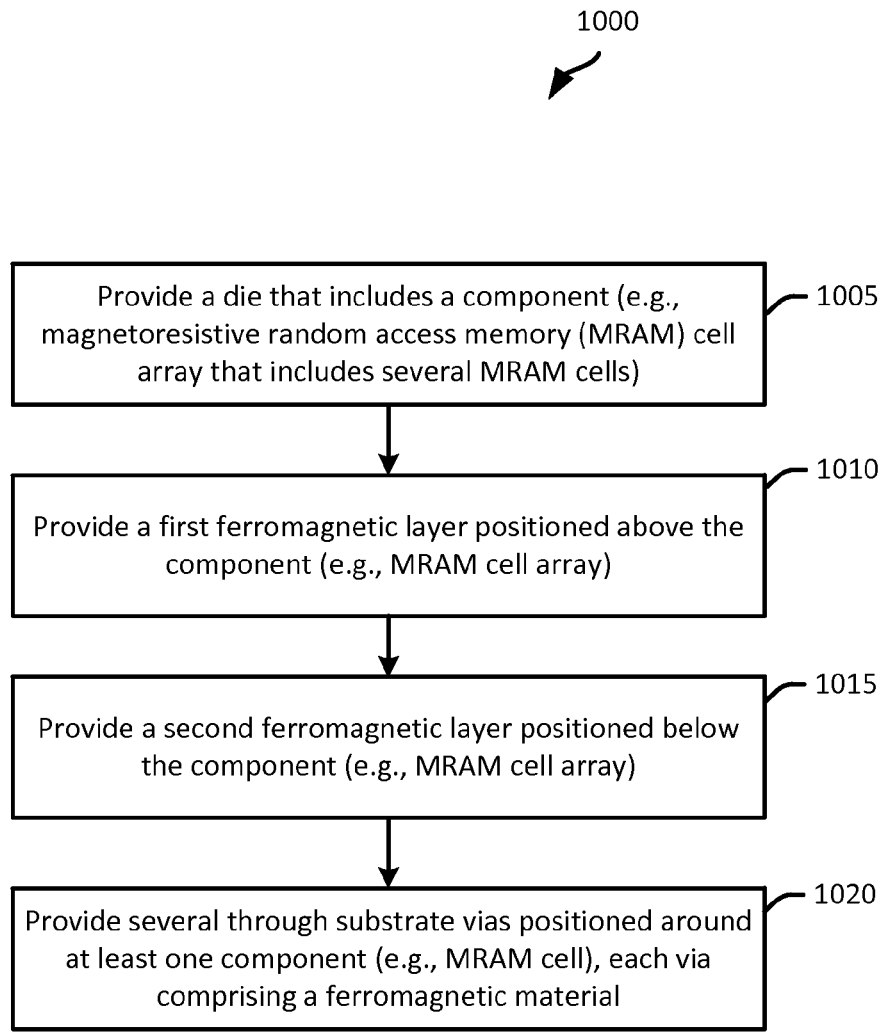

FIG. 10 illustrates a flow diagram of an overview method for manufacturing a die that includes an MRAM cell array and magnetic shielding.

Figure 11:
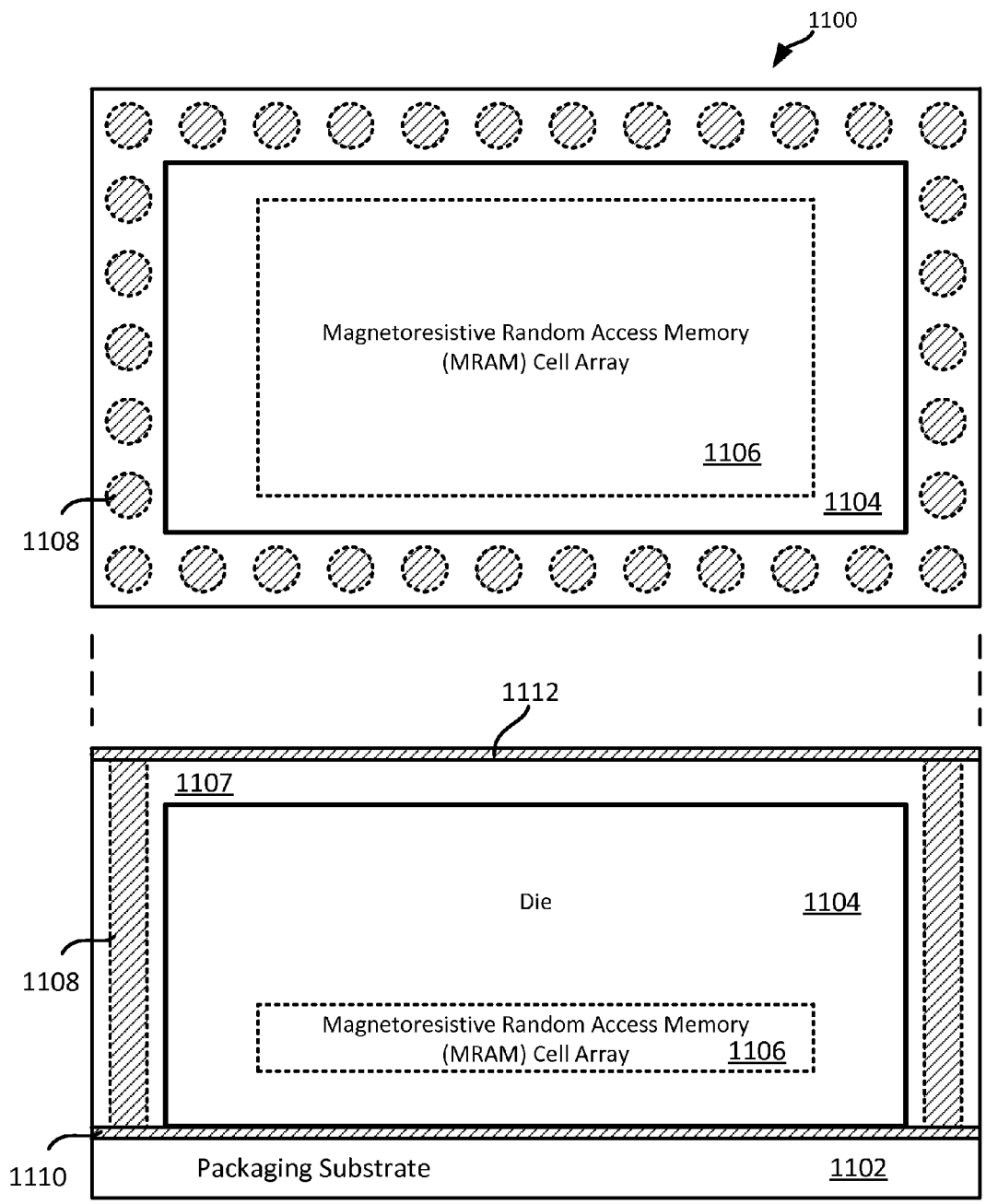

FIG. 11 illustrates a die package that includes an MRAM die having an MRAM cell array and magnetic shielding.

Figure 12:
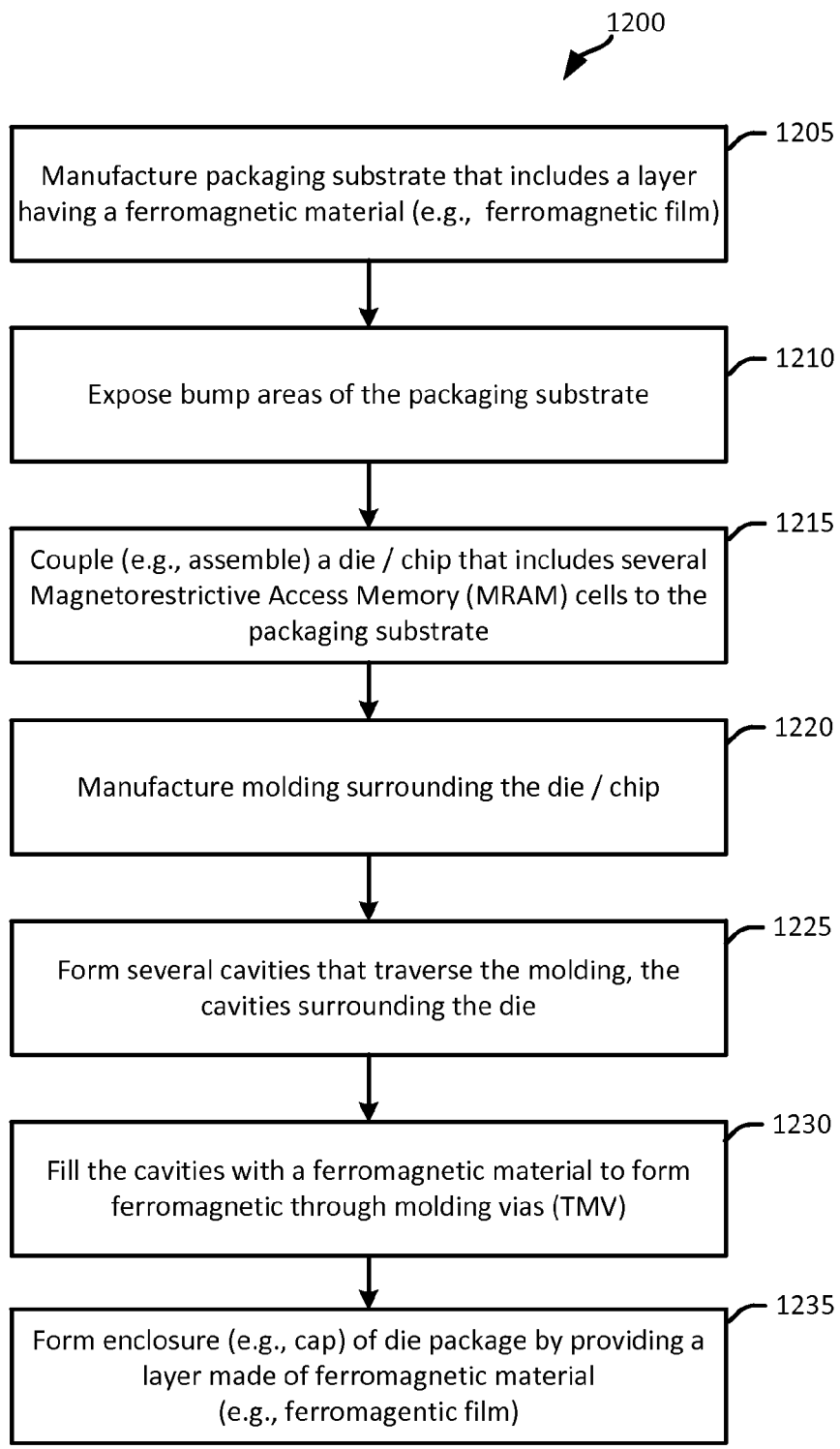

FIG. 12 illustrates a flow diagram of a method for manufacturing a MRAM die having an MRAM cell array and magnetic shielding.

Figure 13A:
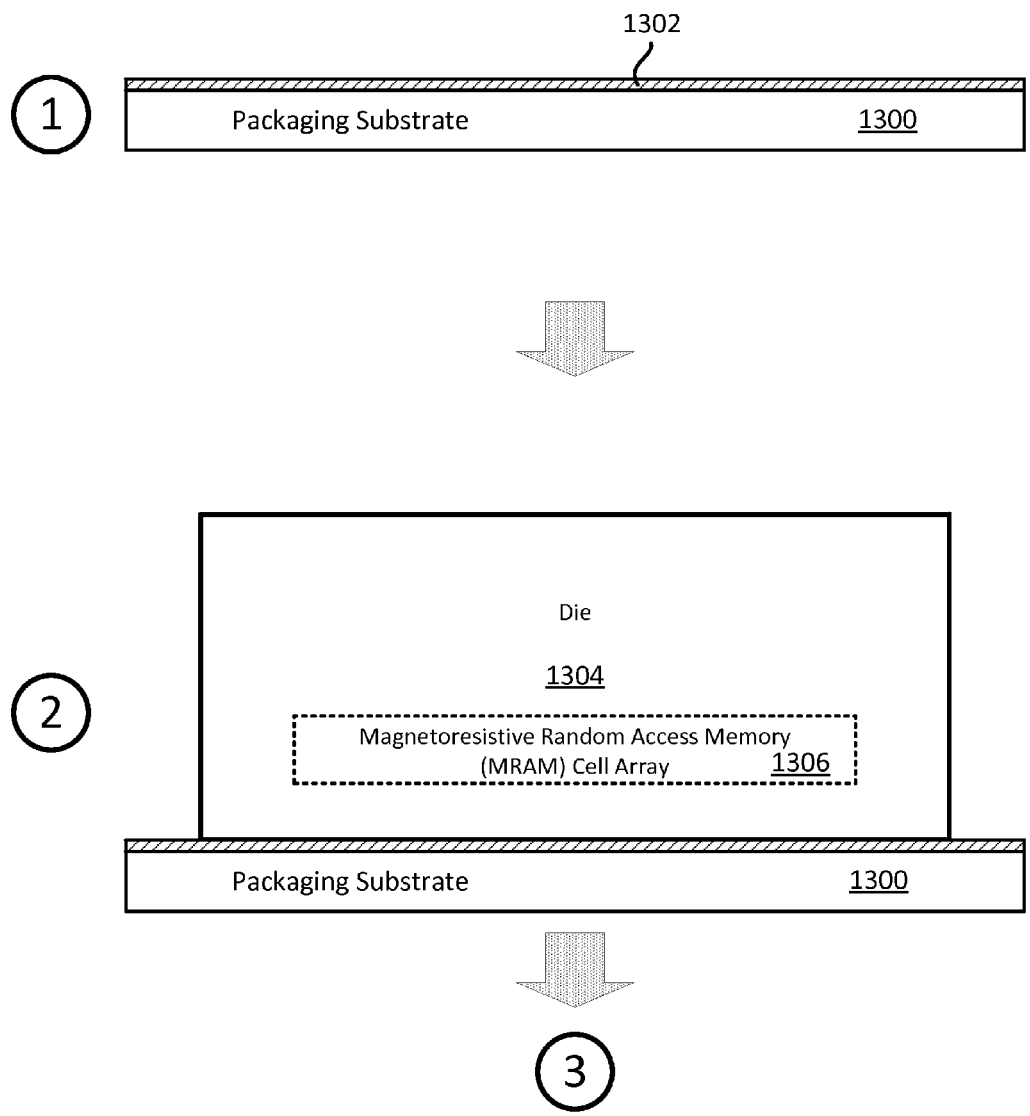
Figure 13B:
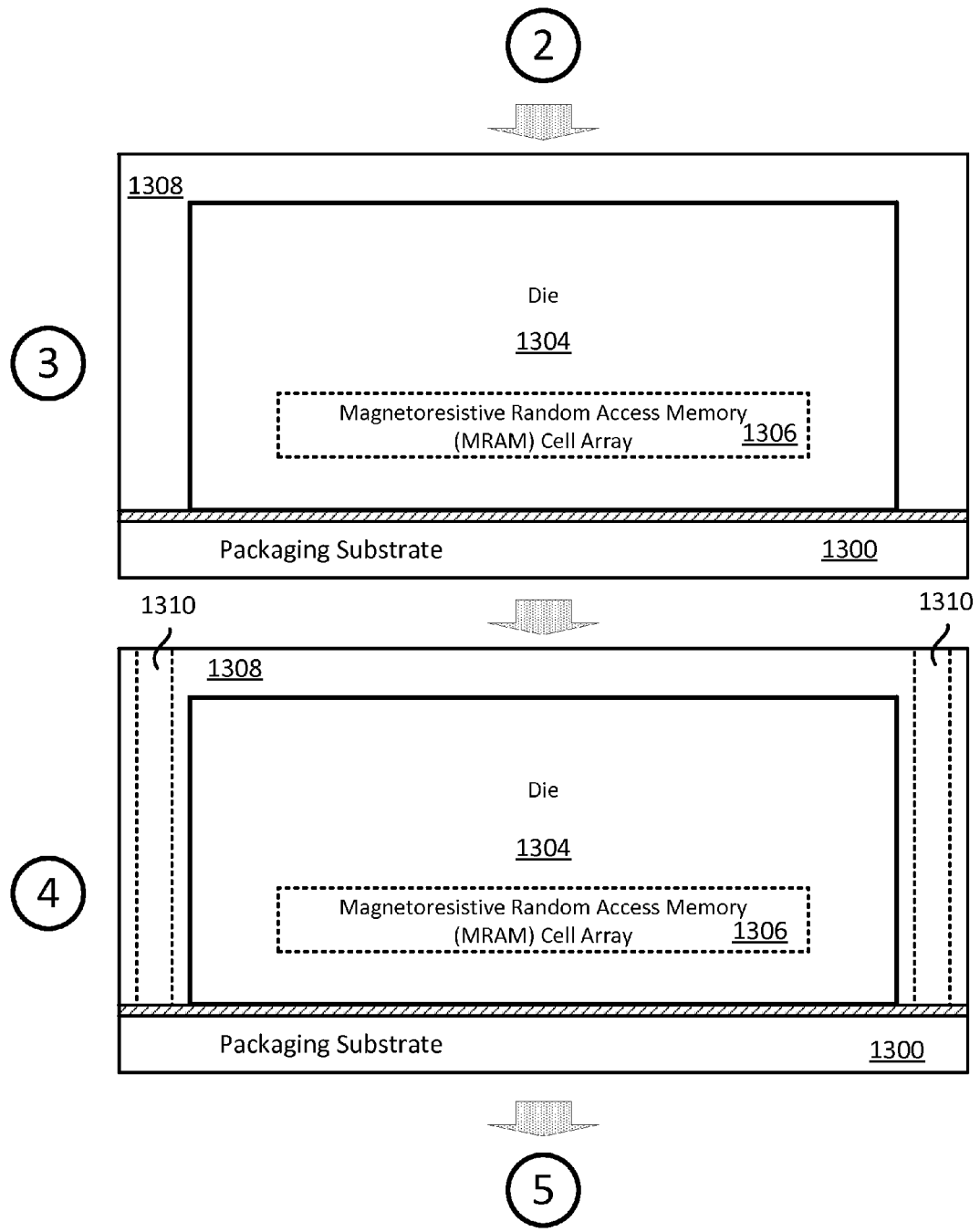
Figure 13C:
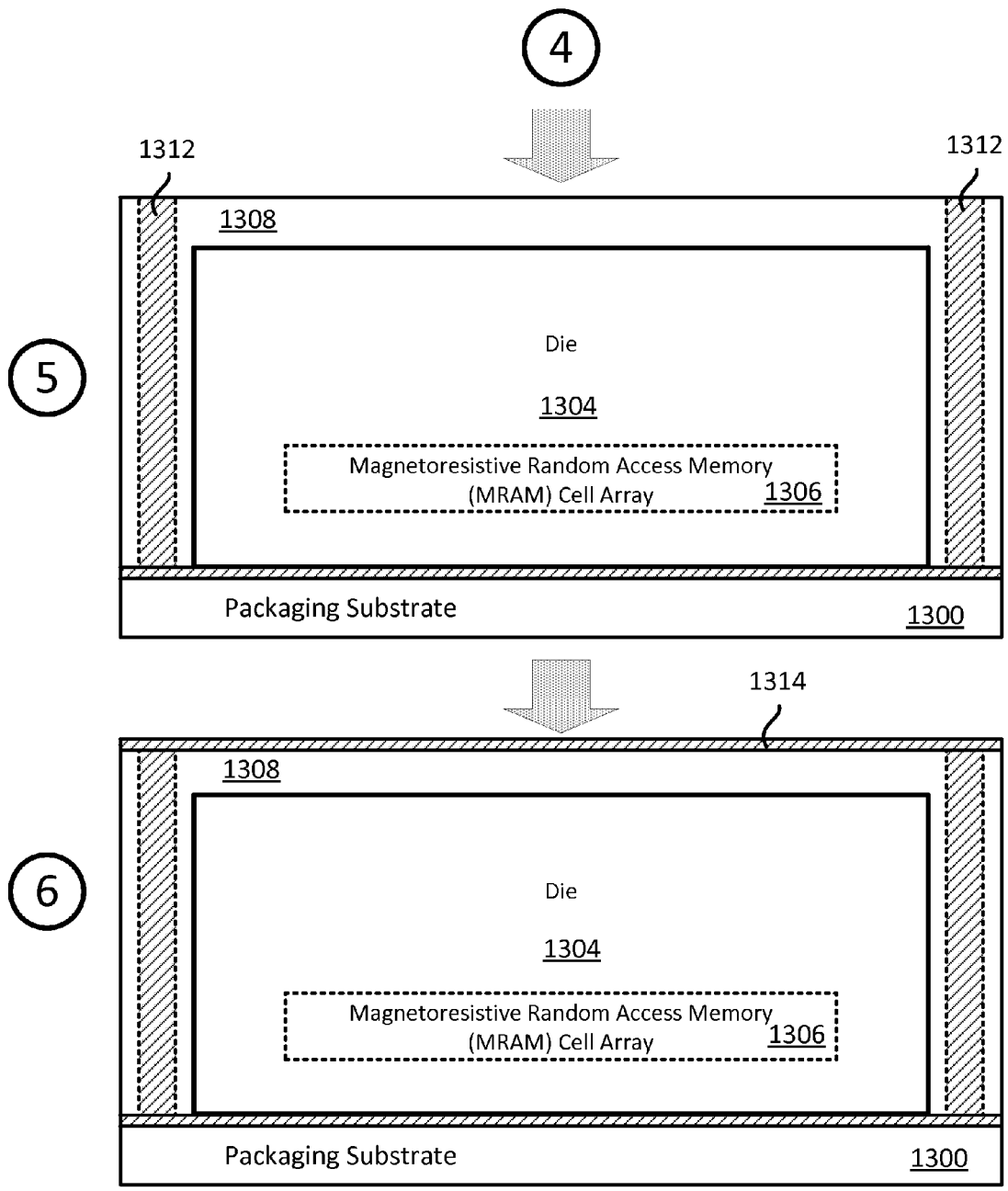

FIGS. 13A-C illustrate a sequence of a method for manufacturing a die that includes an MRAM cell array and magnetic shielding.

Figure 14:
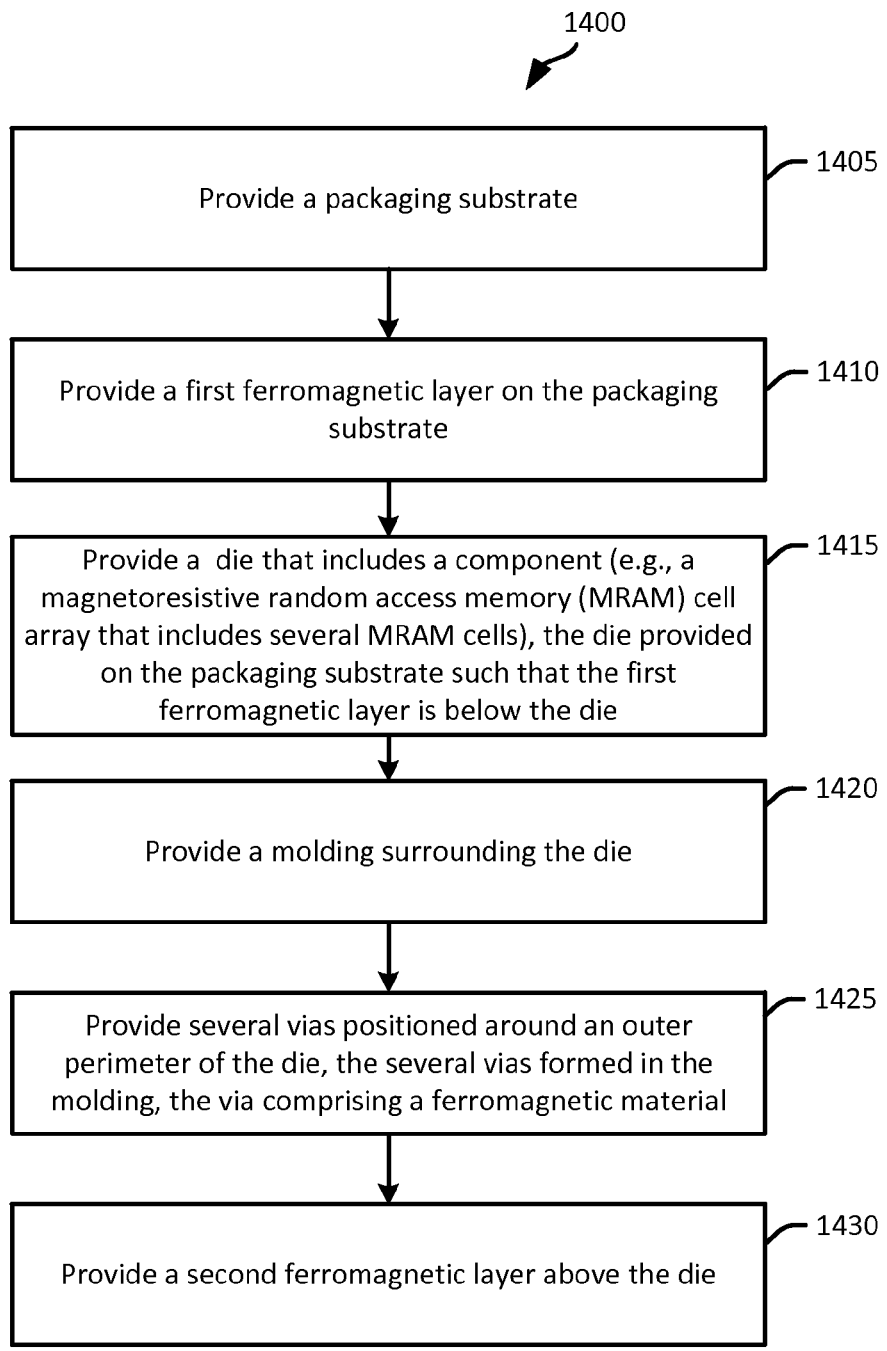

FIG. 14 illustrates a flow diagram of an overview method for manufacturing a MRAM die having an MRAM cell array and magnetic shielding.

Figure 15:
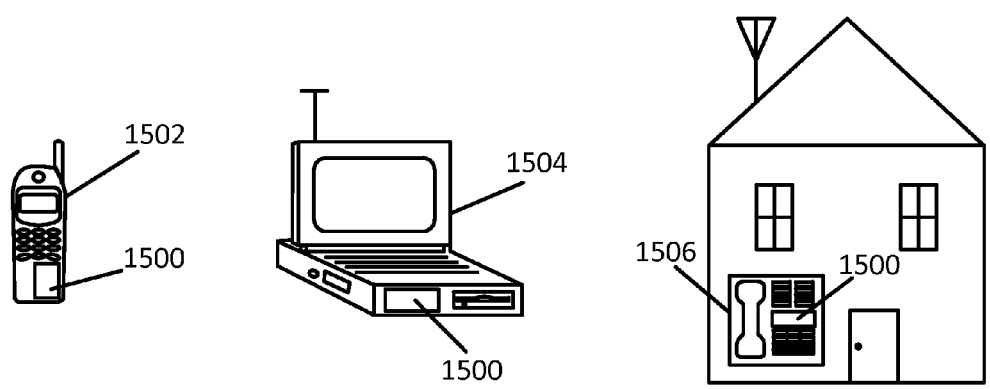

FIG. 15 illustrates various electronic devices that may be integrated with any of the aforementioned integrated circuit, die or package.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Several novel features pertain to a die that includes a magnetoresistive random access memory (MRAM) cell array that includes several MRAM cells. The die also includes a first ferromagnetic layer positioned above the MRAM cell array, a second ferromagnetic layer positioned below the MRAM cell array, and several vias positioned around at least one MRAM cell, the via includes a ferromagnetic material. In some implementations, the first ferromagnetic layer, the second ferromagnetic layer and the several vias define a magnetic shield for the MRAM cell array. The MRAM cell may include a magnetic tunnel junction (MTJ). In some implementations, the several vias traverse at least a metal layer and a dielectric layer of the die. In some implementations, the vias are through substrate vias. In some implementations, the ferromagnetic material has high permeability and high B saturation. Several novel features also pertain to die package that includes a packaging substrate and a die. The die includes a magnetoresistive random access memory (MRAM) cell array that has several MRAM cells. The die is coupled to the packaging substrate. The die package also includes a first ferromagnetic layer below the die, a second ferromagnetic layer above the die, a molding surrounding the die, and several vias positioned around an outer perimeter of the die. The vias are formed in at least the molding. The via includes a ferromagnetic material.

The present disclosure describes a magnetic shield for an MRAM cell array and/or MRAM cell. However, the various methods and magnetic shields described in the present disclosure may be used/configured/adapted to provide magnetic shielding for other components of a die and/or die package. These components may include for example, components that are sensitive to a magnetic field, transformers, and/or components that include a magnetic material. In some implementations, a component that is sensitive to a magnetic field is a component whose functionality may be adversely affected by the presence of a magnetic field.

Exemplary Die with MRAM and Magnetic Shielding

Figure 1:
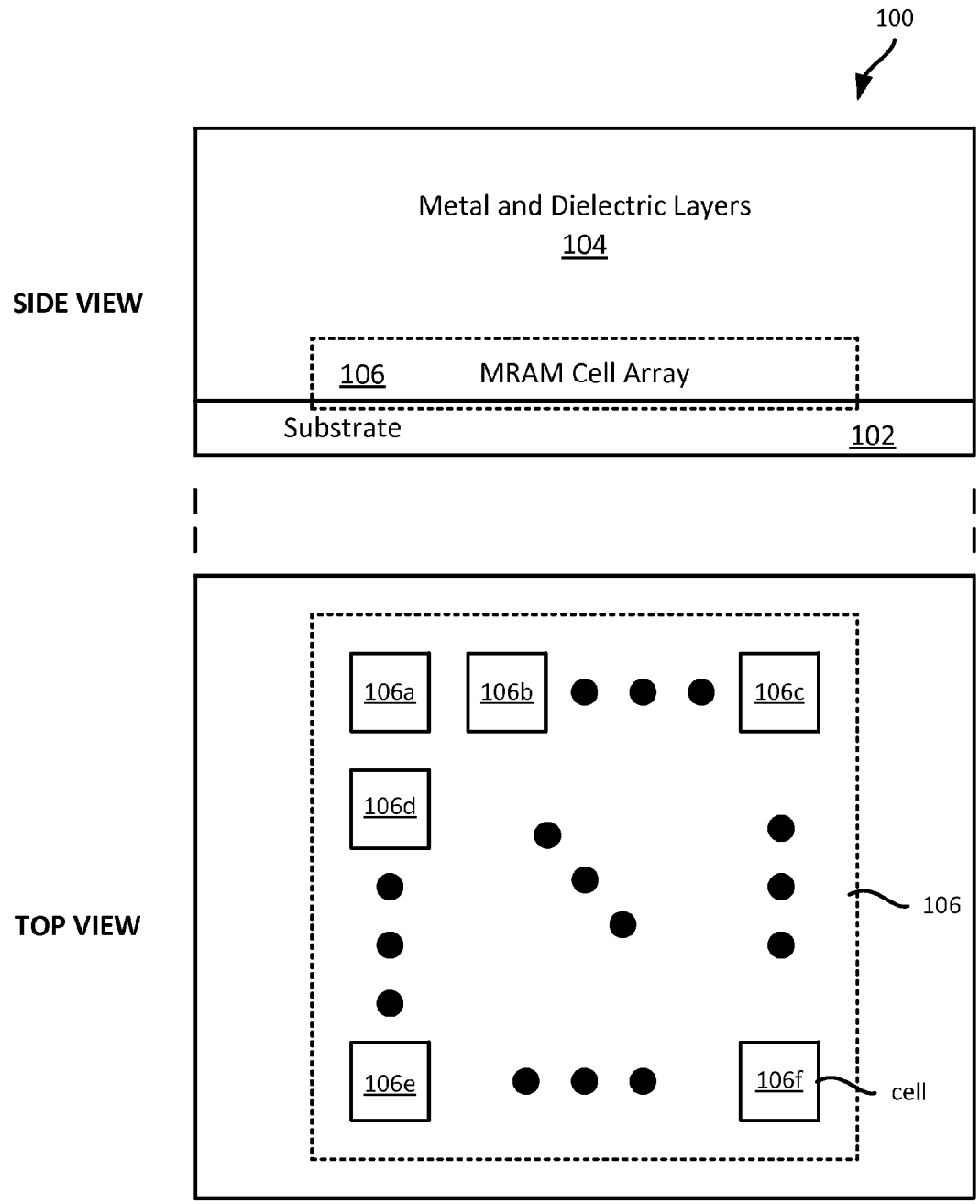
FIG. 1 illustrates a die/wafer that includes a magnetoresistive random access memory (MRAM) cell array.
Figure 4A:
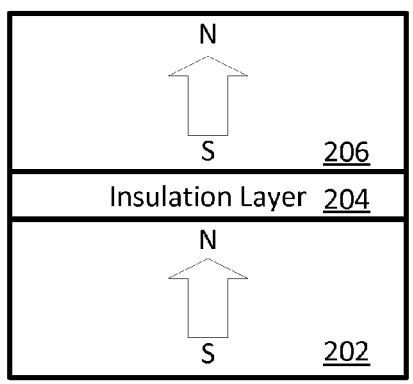
FIG. 4A illustrates another magnetic tunnel junction (MTJ) under low resistance.
Figure 4B:
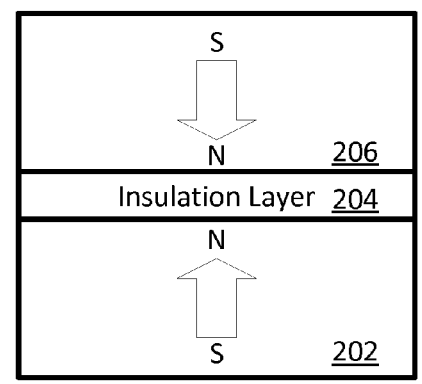
FIG. 4B illustrates another magnetic tunnel junction (MTJ) under high resistance.
Figure 5:
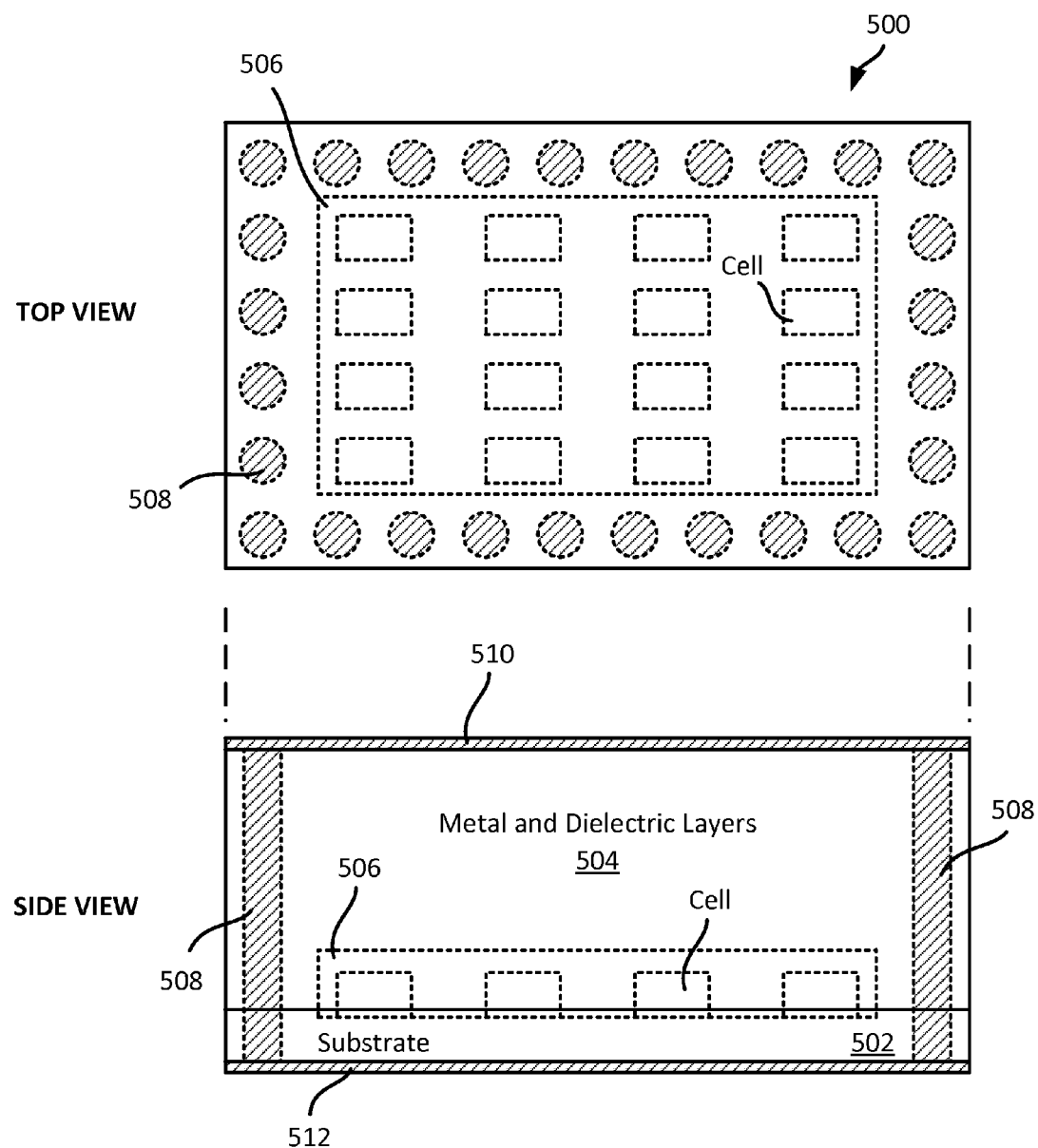
FIG. 5 illustrates a die that includes an MRAM cell array and magnetic shielding.

FIG. 5 conceptually illustrates a die/wafer that includes a magnetoresistive random access memory (MRAM) and magnetic shielding. Specifically, FIG. 5 illustrates a die 500 that includes a substrate 502, several metal and dielectric layers 504, a MRAM cell array 506, several vias 508, a first layer 510 and a second layer 512.

The MRAM cell array 506 includes several cells 506a-l. The cell includes a magnetic tunnel junction (MTJ). In some implementations, the MRAM cell may be an STT-MRAM cell. The vias 508 are vias that traverse the substrate 502 and the metal and dielectric layers 504 in some implementations.

The substrate may be silicon (Si) or may be other materials, for example, glass, sapphire etc. The vias 508 may be made of a ferromagnetic material. A ferromagnetic material may be a material that exhibits ferromagnetism. A ferromagnetic material may have high permeability ($\mu$) and/or high B saturation. In some implementations, the permeability of a material refers to the degree of magnetization that the material obtains in response to an applied magnetic field. In some implementations, the B saturation of a material refers to the state that the material reaches when an increase in magnetic field no longer increases the magnetization of the material. An example of a ferromagnetic material could be silicon steel, Manganese-zinc ferrite (MnZn), and/or permalloy. As shown in FIG. 5, the vias 508 laterally surround the MRAM cell array 506. In the example of FIG. 5, the vias 508 are located at the perimeter of the die 500. In some implementations, the vias 508 may also be located around each MRAM cell (or a set of MRAM cells) from the MRAM cell array 506. In some implementations, the vias 508 provide lateral magnetic shielding for the MRAM cell array 506 of the die 500.

The first layer 510 and the second layer 512 may be made of a ferromagnetic material. In some implementations, the first layer 510, the second layer 512 and the vias 508 may be made of the same ferromagnetic material having high permeability and high B saturation. In some implementations, the first layer 510 and the second layer 512 may be a ferromagnetic film layer (e.g., thin film layer).

As shown in FIG. 5, the first layer 510 is coated on the front side (e.g., front portion) of the die 500 (e.g., side of the die having bump area). As further shown in FIG. 5, the first layer 510 is positioned above the metal and dielectric layers 504. In some implementations, the bump area of a die (e.g., area where bumps (e.g., solder) will be coupled) is manufactured about the first layer 510. There is no electrical connection between the first layer 510 and bumps (not shown). In some implementations, the first layer 510 includes openings that allow bumps (or wire bond) to make a connection with the internal circuit of the die. In some implementations, the first layer 510 is positioned on the die 500 after the last metal and dielectric layers are manufactured on the die 500. In some implementations, the layer 510 may be provided (e.g., inserted) at upper level metal layers (e.g., one or more of the metal layers 504) to cover the MRAM cells (e.g., MTJ cell) but with one or more openings for upper level metal connections. That is, the first layer 510 may be one or more of metal layers 504 of the die 500.

As shown in FIG. 5, the second layer 512 may be coated on the substrate 502 of the die 500. Specifically, the second layer 512 is coated on the exterior portion of the substrate 502. In some implementations, coating the exterior portion of the substrate 502 may be referred to as coating a back side of the die.

In some implementations, the first and second layers 510-512 provide magnetic shield for the MRAM cell array 506 from magnetic field that traverse the die 500 from the top and/or bottom portion of the die (e.g., perpendicular to the top and/or bottom portion of the die).

FIG. 5 illustrates a die with magnetic shielding for an MRAM. However, the magnetic shielding shown and described in FIG. 5 may also be used to provide magnetic shielding for other components of a die. Such components may include for example, components that are sensitive to a magnetic field, transformers, and/or components that include a magnetic material.

Figure 6:
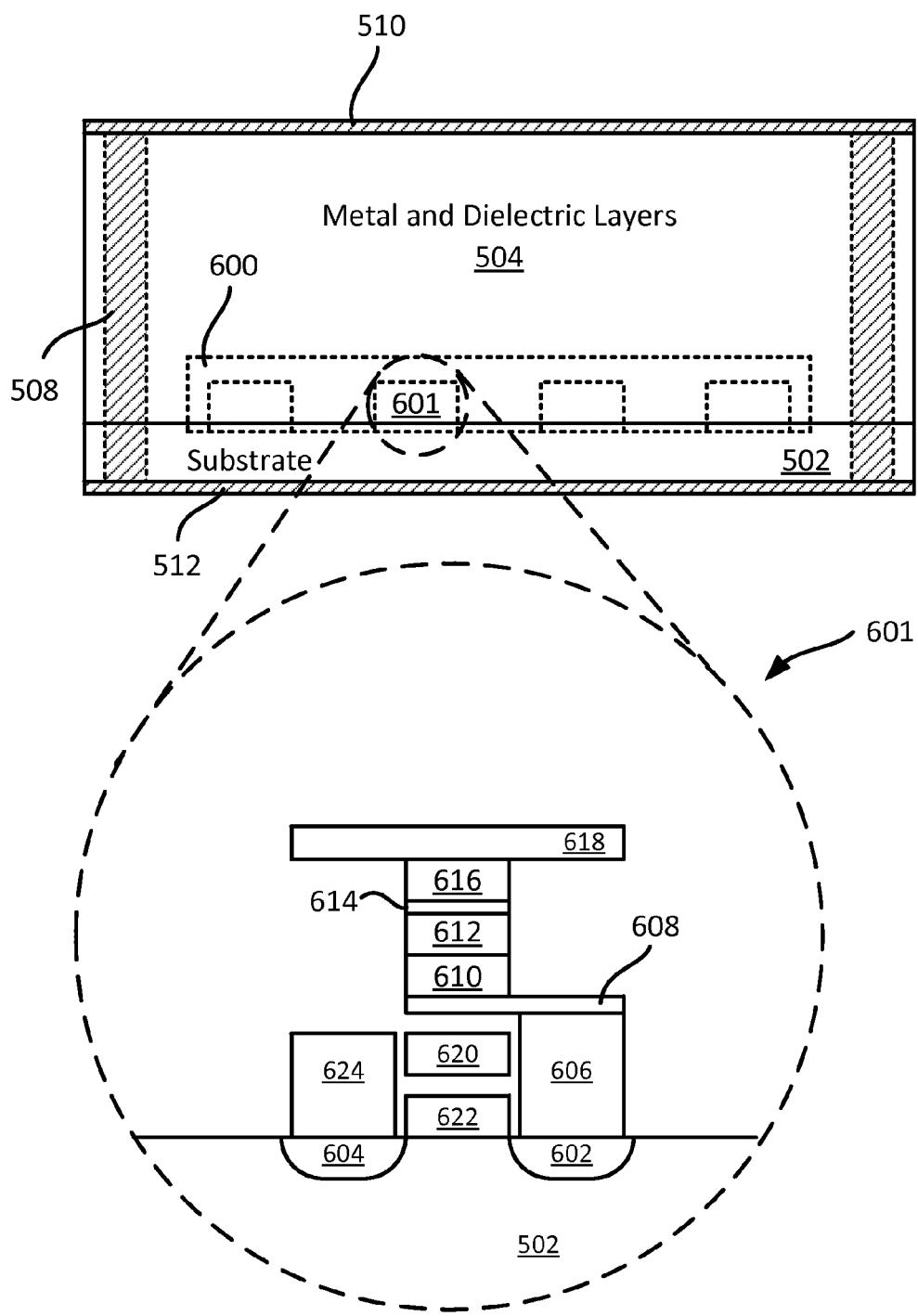
FIG. 6 illustrates a die that includes an MRAM cell array and magnetic shielding, the MRAM cell array includes a MRAM cell.
Figure 7:
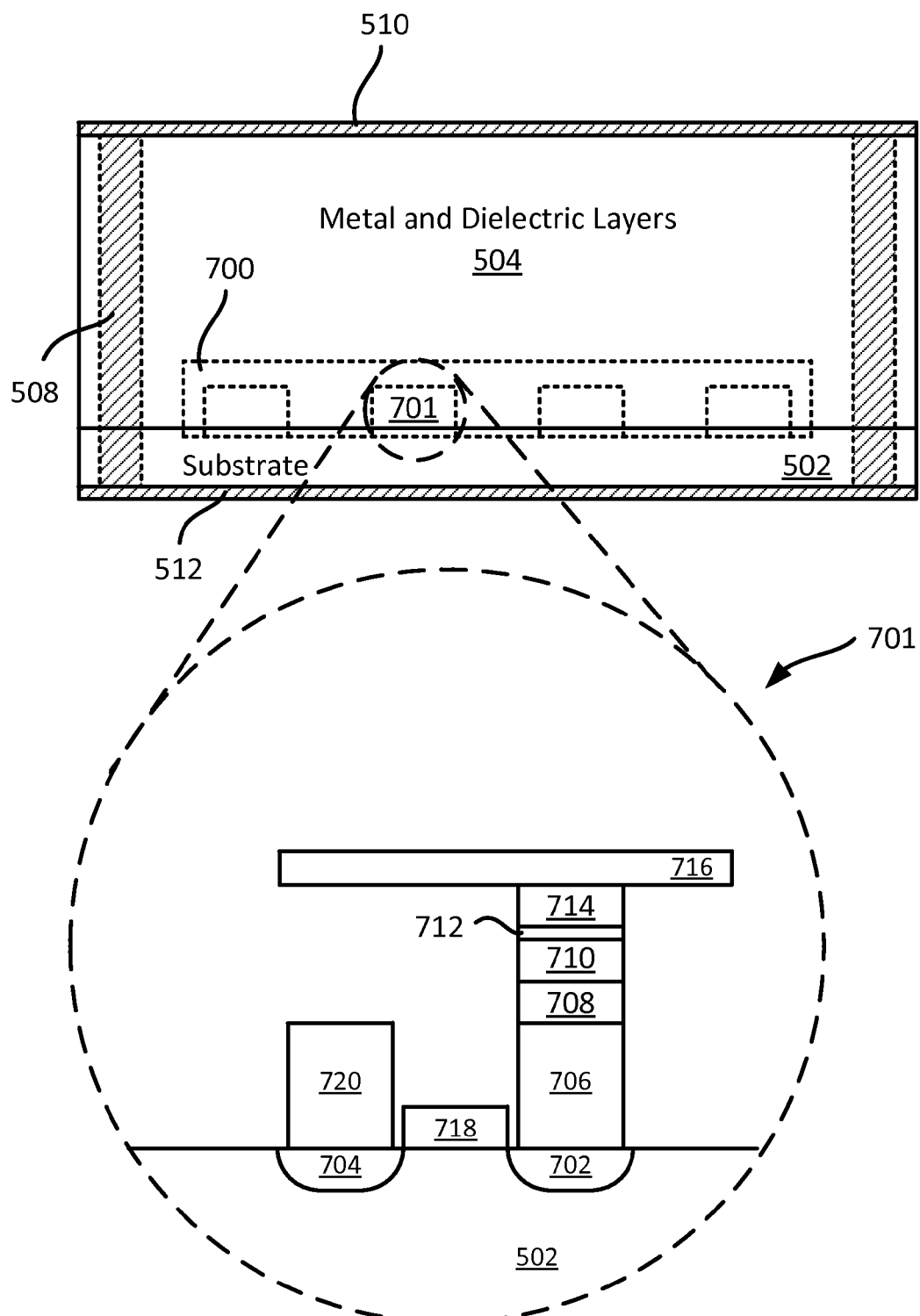
FIG. 7 illustrates another die that includes an MRAM cell array and magnetic shielding, the MRAM cell array includes another MRAM cell.

Different implementations of dice may have different MRAM cell arrays. FIGS. 6-7 illustrate different dice having different MRAM cell arrays. FIG. 6 illustrates a die that includes an MRAM cell array 600 and a magnetic shield. The magnetic shield may include several ferromagnetic vias 508, the first ferromagnetic layer 510, and the second ferromagnetic layer 512. The magnetic shield may provide magnetic shielding from magnetic fields that may traverse the die laterally (e.g., from the side surface of the die) or longitudinally (e.g., from top or bottom surface of the die).

The MRAM cell array 600 includes several MRAM cells, including MRAM cell 601. As shown in FIG. 6, the MRAM cell 601 includes a drain 602, a source 604, a first component 606, a bypass line 608, a layer 610, a fixed magnetic layer 612, an insulation layer 614, a variable magnetic layer 616, and a bit line 618. In some implementations, the fixed magnetic layer 612, the insulation layer 614, and the variable magnetic layer 616 define the magnetic tunnel junction (MTJ) of the MRAM cell 601. In some implementations, the MRAM cell 601 may also include a write line 620, a gate 622 and a second component 624.

FIG. 7 illustrates another die that includes an MRAM cell array 700 and a magnetic shield. The magnetic shield of FIG. 7 may be similar to the magnetic shield of FIG. 6. The magnetic shield of FIG. 7 may include several ferromagnetic vias 508, the first ferromagnetic layer 510, and the second ferromagnetic layer 512. The magnetic shield may provide magnetic shielding from magnetic fields that may traverse the die laterally (e.g., from the side surface of the die) or longitudinally (e.g., from top or bottom surface of the die).

The MRAM cell array 700 includes several MRAM cells, including MRAM cell 701. As shown in FIG. 7, the MRAM cell 701 includes a drain 702, a source 704, a first component 706, a layer 708, a fixed magnetic layer 710, a metal layer 712, a variable magnetic layer 714, and a bit line 716. In some implementations, the fixed magnetic layer 710, the metal layer 712, and the variable magnetic layer 714 define the magnetic tunnel junction (MTJ) of the MRAM cell 701. In some implementations, the MRAM cell 701 may also include a gate 718 and a second component 720. In some implementations, this configuration of the MRAM cell 701 may be referred to as spin transfer torque (STT) MRAM cell.

It should be noted that the MRAM cells illustrated in FIGS. 6-7 are merely exemplary, and should not be construed to limit the application and use of the magnetic shield to these specific MRAM cells. The magnetic shield described in the present disclosure may be applicable to any type and/or configuration of an MRAM cell.

Having described various examples of a die that includes an MRAM and a magnetic shield, a method for manufacturing a die that includes an MRAM and a magnetic shield will now be described below.

Figure 8:
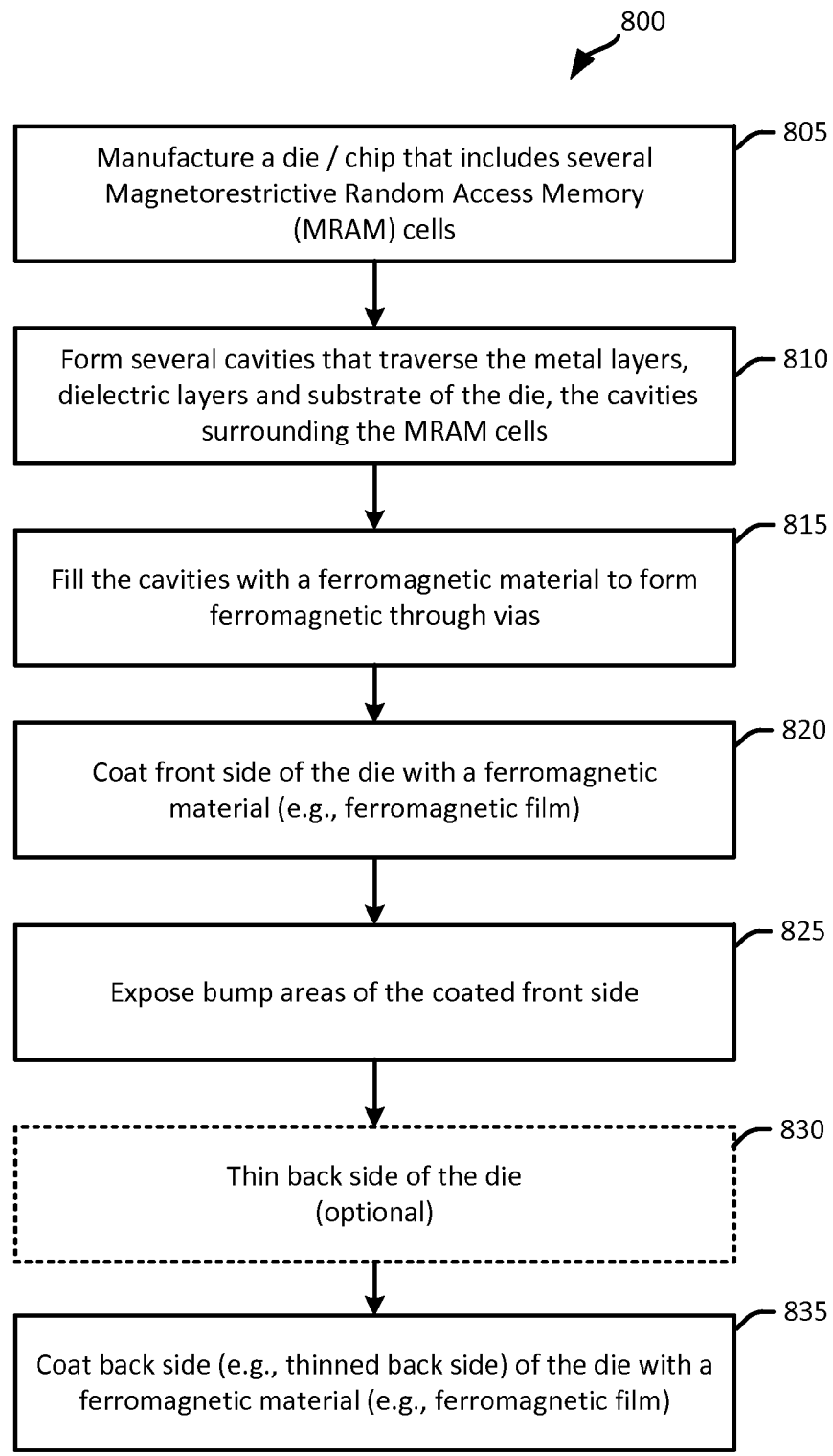
FIG. 8 illustrates a flow diagram of a method for manufacturing a die that includes an MRAM cell array and magnetic shielding.

Exemplary Method for Manufacturing a Die that Includes an MRAM and a Magnetic Shield FIG. 8 illustrates a flow diagram of a method for manufacturing a die that includes an MRAM and a magnetic shield. The method starts by manufacturing (at 805) a die/wafer that includes a magnetoresistive random access memory (MRAM) cell array. The MRAM cell array includes several MRAM cells. The MRAM cell includes a magnetic tunnel junction (MTJ). In some implementations, the MRAM cell may be an STT-MRAM cell. In some implementations, manufacturing (at 805) the die/wafer includes manufacturing/providing a substrate and several metal and dielectric layers.

The method further forms (at 810) several cavities in the die. The cavities may traverse the metal layers, dielectric layers and/or substrate of the die. Different implementations may form the cavities differently. In some implementations, the cavities are formed by etching/drilling holes in the metal layers, dielectric layers, and/or substrate of the die. The etching/drilling of the cavities may be performed by a laser in some implementations. The cavities may traverse part of the die or the entire die in some implementations. Different implementations may form the cavities in different locations of the die. In some implementations, the cavities may be formed as to surround the MRAM cell array (and/or each MRAM cell or a set of MRAM cells) of the die. In some implementations, the cavities are formed at the perimeter of the die.

Once the cavities are formed (at 810), the method fills (at 815) the cavities with a ferromagnetic material. In some implementations, filling (at 815) the cavities forms the ferromagnetic vias in the die. The ferromagnetic vias may be through vias (e.g, through substrate via (TSVs)) in some implementations. In some implementations, the vias made of a ferromagnetic material provide a magnetic shield from a magnetic field along a lateral direction of the die (e.g., protection from a magnetic shield from the side surface of the die). The ferromagnetic material that is used to fill the cavities and forms the vias may have high permeability and high B saturation in some implementations.

The method then coats (at 820) the front side (e.g., front portion) of the die with a ferromagnetic material. In some implementations, coating the front side of the die with a ferromagnetic material may include depositing a ferromagnetic film layer on a metal layer and/or dielectric layer of the die. The first layer 510 of FIG. 5 is an example of a ferromagnetic material that may be coated on a die in some implementations.

After coating (at 820) the front side of the die with a ferromagnetic material, the method exposes (at 825) bump area of the coated front side. In some implementations, exposing the bump area including etching area of the coated front to define bump area, where solder may be coupled to in some implementations.

The method may further optionally thin (at 830) the back side (e.g., back portion or substrate portion) of the die. In some implementations, thinning the back side of the die includes thinning the substrate. The method then coats (at 835) the back side of the die with a ferromagnetic material. In some implementations, coating the back side may include coating an exterior portion of a substrate of the die. In some implementations, coating the back side of the die with a ferromagnetic material may include depositing a ferromagnetic film layer on a substrate (e.g., thinned substrate) of the die. The second layer 512 of FIG. 5 is an example of a ferromagnetic material that may be coated on a die in some implementations.

Although, the method of FIG. 8 describes coating the front side (e.g., front portion) of die first, in some implementations, the back side (e.g., back portion) of the die may be coated before the front side of the die. Different implementations may perform the method differently.

Exemplary Sequence for Manufacturing a Die that Includes an MRAM and a Magnetic Shield FIGS. 9A-9C illustrates a sequence for manufacturing a die that includes an MRAM and a magnetic shield. The sequence starts at stage 1 with a die/wafer 900 that includes a substrate 902 and metal and dielectric layers 904. The die/wafer 900 also includes a magnetoresistive random access memory (MRAM) cell array 906. The MRAM cell array 906 includes several MRAM cells. The MRAM cell includes a magnetic tunnel junction (MTJ). In some implementations, the MRAM cell may be an STT-MRAM cell.

At stage 2, several cavities 908 are formed in the die 900. The cavities 908 may traverse the metal layers, dielectric layers and/or substrate 902 of the die 900. Different implementations may form the cavities differently. In some implementations, the cavities are formed by etching/drilling holes in the metal layers, dielectric layers, and/or substrate of the die 900. The etching/drilling of the cavities may be performed by a laser in some implementations. The cavities 908 may traverse part of the die or the entire die in some implementations. Different implementations may form the cavities in different locations of the die. In some implementations, the cavities 908 may be formed as to surround the MRAM cell array 906 of the die 900. In some implementations, the cavities 908 are formed at the perimeter of the die 900.

At stage 3, the cavities 908 are filled with a ferromagnetic material. In some implementations, the filling of the cavities forms the ferromagnetic vias 910 in the die 900. The ferromagnetic vias 910 may be through vias (e.g., through substrate vias (TSVs)) in some implementations. In some implementations, the vias 910 made of a ferromagnetic material provide a magnetic shield from a magnetic field along a lateral direction of the die 900 (e.g., protection from a magnetic field from the side surface of the die). The ferromagnetic material that is used to fill the cavities 908 and forms the vias 910 may have high permeability and high B saturation in some implementations.

At stage 4, the front side (e.g., front portion) of the die is coated with a layer 912 having a ferromagnetic material. In some implementations, coating the front side of the die with a ferromagnetic material may include depositing a ferromagnetic film layer (e.g., layer 912) on a metal layer and/or dielectric layer of the die 900.

At stage 5, the back side (e.g., back portion/substrate portion) of the die 900 is thinned. In some implementations, thinning the back side of the die includes thinning the substrate 902 of the die 900. The thinning of the back side of the die is optional in some implementations.

At stage 6, a layer 914 having a ferromagnetic material is coated (e.g., deposited) on the back side (e.g., back portion) of the die 900. In some case, a dielectric layer may be provided (e.g., deposited) first before providing the ferromagnetic layer 914. In some implementations, coating the back side (e.g., back portion) of the die 900 may include coating an exterior portion of the substrate 902 of the die 900. In some implementations, coating the back side of the die 900 with a ferromagnetic material may include depositing a ferromagnetic film layer (e.g., layer 914) on the substrate 902 (e.g., thinned substrate) of the die 900.

Exemplary Overview Method for Providing a Die that Includes an MRAM and a Magnetic Shield The method of FIG. 8 and the sequence of FIGS. 9A-C illustrate a detailed method and sequence for manufacturing a die that includes a magnetoresistive random access memory (MRAM) and a magnetic shield. Such a detailed method and sequence can be conceptually simplified into an overview method for providing a die that includes an MRAM and a magnetic shield, as illustrated in FIG. 10.

FIG. 10 will be described with respect to providing a die that includes an MRAM. However, the method described in FIG. 10 may also be used to provide a die that includes other components that require magnetic shielding or may benefit from magnetic shielding. Such components may include for example, components that are sensitive to a magnetic field, transformers, and/or components that include a magnetic material.

As shown in FIG. 10, the method provides (at 1005) a die that includes a component (e.g., magnetoresistive random access memory (MRAM) cell array that includes several MRAM cells). In some implementations, providing the MRAM cell array includes manufacturing a die that includes MRAM cells. An MRAM cell includes a magnetic tunnel junction (MTJ). Different implementations may include different MRAM cells. Stage 1 of FIG. 9A illustrates an example of providing an MRAM cell array in some implementations.

The method provides (at 1010) a first ferromagnetic layer positioned above the component (e.g., MRAM cell array). In some implementations, the first ferromagnetic layer is a ferromagnetic thin film. Different implementations may provide the first ferromagnetic layer differently. In some implementations, providing the first ferromagnetic layer includes depositing (e.g., coating) a ferromagnetic layer on a front side of the die. In some implementations, the first ferromagnetic layer may be part of one or more metal layers of the die (e.g., inside the die). Stage 4 of FIG. 9B illustrates an example of providing a first ferromagnetic layer in some implementations.

The method provides (at 1015) a second ferromagnetic layer positioned below the component (e.g., MRAM cell array). Different implementations may provide the second ferromagnetic layer differently. In some implementations, providing the second ferromagnetic layer includes depositing (e.g., coating) a ferromagnetic layer on a back side of the die (e.g., on the substrate side of the die). In some implementations, providing the second ferromagnetic layer may include thinning a portion of the substrate. Stage 6 of FIG. 9C illustrates an example of providing a second ferromagnetic layer in some implementations.

The method provides (at 1020) several vias positioned around at least one component (e.g., MRAM cell). The via includes a ferromagnetic material. In some implementations, providing the several vias include providing through vias (e.g., vias that traverse a substrate). The substrate may be a silicon substrate in some implementations. In some implementations, providing the several vias includes manufacturing (e.g., drilling) several cavities that traverse the metal layers, dielectric layers and/or substrate of the die and filling the cavities with a ferromagnetic material to form the vias. Stages 2-3 of FIGS. 9A-9B illustrate an example of providing several vias in some implementations.

It should be noted that the order in which the first ferromagnetic layer, the second ferromagnetic layer and the vias are provided in FIGS. 8, 9A-9C and 10 are merely exemplary. In some implementations, the order can be switched or rearranged. For example, in some implementations, the vias are first provided before providing the first and/or second ferromagnetic layers. In addition, some of the steps of FIGS. 8, 9A-9C and 10 can be combined.

Having described a structure, method and sequence for providing magnetic shielding for a die, another structure, method and sequence for providing magnetic shielding will now be described below Exemplary Die Package Having Die with MRAM and Magnetic Shielding FIG. 11 conceptually illustrates a die package that includes a die/wafer that has a magnetoresistive random access memory (MRAM) and magnetic shielding. Specifically, FIG. 11 illustrates a die package 1000 that includes a packaging substrate 1102 and a die 1104. As shown in FIG. 11, the die 1104 includes a MRAM cell array 1104. The MRAM cell array 1104 may includes several MRAM cells (e.g., MRAM cell 601, MRAM cell 701). The MRAM cell may include a magnetic tunnel junction (MTJ). In some implementations, the MRAM cell may be an STT-MRAM cell. The die package 1100 also includes a molding 1107, several vias 1108, a first layer 1110 and a second layer 1112.

The molding 1107 encapsulates the die 1104. The vias 1108 are vias that traverse the molding 1107. As such, in some implementations, the vias 1108 may be through molding vias (TMVs). In some implementations, the vias 1108 may also traverse the packaging substrate 1102. The vias 1108 may be made of a ferromagnetic material. The ferromagnetic material may have high permeability and high B saturation. Different implementations may form the vias 1108 differently. In some implementations, after the molding (e.g., molding 1107) is provided, cavities are formed (e.g., etched, drilled) in the molding. In some implementations, a laser may be used to drill cavities in the molding of the die package. Once the cavities are formed, the cavities may be filled with a material (e.g., ferromagnetic material) to form the vias 1108. As shown in FIG. 11, the vias 1108 laterally surround the die 1102. In the example of FIG. 11, the vias 1108 are located at the perimeter of the die package 1100. However, the vias 1108 may be located in different locations. In some implementations, the vias 1108 provide lateral magnetic shielding for the MRAM cell array 1104 of the die 1102.

The first layer 1110 and the second layer 1112 may be made of a ferromagnetic material. In some implementations, the first layer 1110, the second layer 1112 and the vias 1108 may be made of the same ferromagnetic material having high permeability and high B saturation. In some implementations, the first layer 1110 and the second layer 1112 may be a ferromagnetic film layer.

As shown in FIG. 11, the first layer 1110 may be a first metal layer of the packaging substrate 1102. The first layer 1110 may be formed during the manufacturing of the packaging substrate 1102. As further shown in FIG. 11, the second layer 1112 is formed on top of the molding 1107 to create a cap that forms the die package 1100 in some implementations. The first and second layers 1110-1112 provide magnetic shielding for the MRAM cell array 1104 from a magnetic field that traverse the die package 1100 from the top and/or bottom portion of the die package (e.g., perpendicular to the top and/or bottom portion of the die package) in some implementations. The second layer 1112 could be at the bottom of packaging substrate 1102 in some implementations.

FIG. 11 illustrates a die package with magnetic shielding for a die with a MRAM. However, the magnetic shielding shown and described in FIG. 11 may also be used to provide magnetic shielding for other components of a die and/or die package. Such components may include for example, components that are sensitive to a magnetic field, transformers, and/or components that include a magnetic material.

Having described various examples of a die package that includes an MRAM die and a magnetic shield, a method for manufacturing a die package that includes an MRAM die and a magnetic shield will now be described below.

Exemplary Method for Manufacturing a Die Package that Includes an MRAM Die and a Magnetic Shield FIG. 12 illustrates a flow diagram of a method for manufacturing a die package that that includes an MRAM die and a magnetic shield. The method starts by manufacturing (at 1205) a packaging substrate that includes a layer having a ferromagnetic material. The ferromagnetic material may be a material having high permeability and high B saturation. The layer may be a ferromagnetic film layer. In some implementations, the layer having the ferromagnetic material may be the first metal layer of the packaging substrate.

The method then exposes (at 1210) bump areas of the packaging substrate. The bump area may be portions of the packaging substrate that will be coupled to a die in some implementations.

Next, the method couples (at 1215) a die/wafer that includes a magnetoresistive random access memory (MRAM) cell array to the packaging substrate. The MRAM cell array includes several MRAM cells. The MRAM cell includes a magnetic tunnel junction (MTJ). In some implementations, the MRAM cell may be an STT-MRAM cell. In some implementations, coupling the die to the packaging substrate includes assembling the die to the packaging substrate.

Next, the method forms (at 1220) a molding around the die. In some implementations, forming the molding includes covering the die with a molding material to protect the die. Different implementations may provide different molding.

The method further forms (at 1225) several cavities in the molding. The cavities may traverse the molding and the packaging substrate in some implementations. Different implementations may form the cavities differently. In some implementations, the cavities are formed by etching/drilling holes in the molding and the packaging substrate. The etching/drilling of the cavities may be performed by a laser in some implementations. The cavities may traverse part of or the entire molding and/or packaging substrate in some implementations. Different implementations may form the cavities in different locations of the die package. In some implementations, the cavities may be formed as to surround the MRAM cell array of the die. In some implementations, the cavities are formed at the perimeter of the die package (e.g., perimeter of molding and/or substrate).

Once the cavities at formed (at 1225), the method fills (at 1230) the cavities with a ferromagnetic material. In some implementations, filling (at 1230) the cavities form the ferromagnetic vias in the die package (e.g., molding of the die package). The ferromagnetic vias may be through molding vias (TMVs) in some implementations. In some implementations, the vias made of a ferromagnetic material provide a magnetic shield from a magnetic field along a lateral direction of the die package (e.g., protection from a magnetic field from the side surface of the die package). The ferromagnetic material that is used to fill the cavities and forms the vias may have high permeability and high B saturation in some implementations.

The method then forms (at 1235) an enclosure of the die package by providing a layer made of ferromagnetic material. The layer may be formed above the molding. The layer may be a ferromagnetic film layer. The second layer 1112 of FIG. 11 is an example of a ferromagnetic material that may be formed on a die package in some implementations.

Exemplary Sequence for Manufacturing a Die Package that Includes an MRAM Die and a Magnetic Shield FIGS. 13A-C illustrate a sequence for manufacturing a die package that includes an MRAM die and a magnetic shield. At stage 1, a packaging substrate 1300 includes a layer 1302. The packaging substrate 1300 is the substrate for a die package in some implementations. The layer 1302 is a first metal layer of the packaging substrate in some implementations. The layer 1302 may have a ferromagnetic material. The ferromagnetic material may be a material having high permeability and high B saturation. The layer 1302 may be a ferromagnetic film layer (e.g., thin film layer). In some implementations, the layer 1302 may be on the other side of the packaging substrate 1300 or on both sides of the packaging substrate 1300.

At stage 2, a die 1304 is coupled to the packaging substrate 1300. In some implementations, bump areas in the substrate 1300 and layer 1302 are provided/defined prior to the die 1304 being coupled to the packaging substrate 1300. The die 1304 is a wafer that includes a magnetoresistive random access memory (MRAM) cell array 1306. The MRAM cell array 1306 includes several MRAM cells. The MRAM cell includes a magnetic tunnel junction (MTJ). In some implementations, the MRAM cell may be a STT-MRAM cell. In some implementations, the coupling of the die 1304 to the packaging substrate 1300 includes the assembling of the die 1304 to the packaging substrate 1300. The die 1304 may be coupled to the packaging substrate such that the layer 1302 is below the die.

At stage 3, a molding 1308 is formed around the die 1304. The molding 1308 is a molding material that helps protect the die 1304. The molding 1308 may completely surround the die 1304 or the molding 1308 may form walls around the die 1304.

At stage 4, several cavities 1310 are formed in the molding 1308. The cavities 1310 may traverse the molding 1310 and the packaging substrate 1300 in some implementations. Different implementations may form the cavities 1310 differently. In some implementations, the cavities 1310 are formed by etching/drilling holes in the molding 1310 and the packaging substrate 1300. The etching/drilling of the cavities 1310 may be performed by a laser in some implementations. The cavities 1310 may traverse part of or the entire molding 1310 and/or packaging substrate 1300 in some implementations. Different implementations may form the cavities 1310 in different locations of a die package. In some implementations, the cavities 1310 may be formed as to surround the MRAM cell array 1306 of the die 1304. In some implementations, the cavities 1310 are formed at the perimeter of the die package (e.g., perimeter of molding and/or substrate).

At stage 5, the cavities 1310 are filled with a ferromagnetic material. In some implementations, the filling of the cavities 1310 form the ferromagnetic vias 1312 in the molding 1308 of the die package. The ferromagnetic vias 1312 may be through molding vias (TMVs) in some implementations. In some implementations, the vias 1312 provide a magnetic shield from a magnetic field along a lateral direction of a die package (e.g., protection from a magnetic field from the side surface of the die package). The ferromagnetic material that is used to fill the cavities 1310 and forms the vias 1312 may have high permeability and high B saturation in some implementations.

At stage 6, an enclosure of a die package by providing a layer 1314 made of ferromagnetic material. The layer 1314 may be formed above the molding 1308. The layer 1214 may be a ferromagnetic film layer.

Exemplary Overview Method for Providing a Die Package that Includes an MRAM Die and a Magnetic Shield The method of FIG. 12 and the sequence of FIGS. 13A-C illustrate a detailed method and sequence for manufacturing a die package that includes a magnetoresistive random access memory (MRAM) die and a magnetic shield. Such a detailed method and sequence can be conceptually simplified into an overview method for providing a die package that includes an MRAM die and a magnetic shield, as illustrated in FIG. 14.

FIG. 14 will be described with respect to providing a die package with a die that includes an MRAM. However, the method described in FIG. 14 may also be used to provide a die package that includes other components that require magnetic shielding or may benefit from magnetic shielding. Such components may include for example, components that are sensitive to a magnetic field, transformers, and/or components that include a magnetic material.

As shown in FIG. 14, the method provides (at 1405) a packaging substrate. Different implementations may use different packaging substrates. The method provides (at 1410) a first ferromagnetic layer on the packaging substrate. The first ferromagnetic layer may be deposited and/or coated on either or both sides of the packaging substrate in some implementations. The second ferromagnetic layer may be a thin film ferromagnetic layer. Stage 1 of FIG. 13A illustrates an example of a packaging substrate that include a first ferromagnetic layer in some implementations.

The method provides (at 1415) a die that includes a component (e.g., magnetoresistive random access memory (MRAM) cell array that includes several MRAM cells). An MRAM cell includes a magnetic tunnel junction (MTJ). Different implementations may include different MRAM cells. The die is provided (at 1415) on the packaging substrate such that the first ferromagnetic layer is below the die. In some implementations, providing the die includes assembling the die on the packaging substrate. Stage 2 of FIG. 13A illustrates an example of a die being provided on a packaging substrate in some implementations.

Next, the method provides (at 1420) a molding surrounding the die. Different implementations may use different molding materials. Stage 3 of FIG. 13B illustrates an example of a molding being provided around a die in some implementations.

The method provides (at 1425) several vias positioned around an outer perimeter of the die. The several vias are formed in the molding. The via includes a ferromagnetic material. In some implementations, providing the several vias includes manufacturing (e.g., drilling) several cavities that traverse the molding surrounding the die and filling the cavities with a ferromagnetic material to form the vias. Stages 4-5 of FIGS. 13-B13C illustrate an example of providing several vias in a molding in some implementations.

The method then provides (at 1430) a second ferromagnetic layer positioned above the die. In some implementations, the second ferromagnetic layer is a ferromagnetic thin film. Different implementations may provide the second ferromagnetic layer differently. Stage 6 of FIG. 13C illustrates an example of providing a second ferromagnetic layer in some implementations.

It should be noted that the order in which the first ferromagnetic layer, the second ferromagnetic layer and the vias are provided in FIGS. 12, 13A-13C and 14 are merely exemplary. In some implementations, the order can be switched or rearranged. In addition, some of the steps of FIGS. 12, 13A-13C and 14 can be combined.

Exemplary Electronic Devices

FIG. 15 illustrates various electronic devices that may be integrated with any of the aforementioned integrated circuit, die or package. For example, a mobile telephone 1502, a laptop computer 1504, and a fixed location terminal 1506 may include an integrated circuit (IC) 1500 as described herein. The IC 1500 may be, for example, any of the integrated circuits, dice or packages described herein. The devices 1502, 1504, 1506 illustrated in FIG. 15 are merely exemplary. Other electronic devices may also feature the IC 1500 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications device, smartphones, tablet computers or any other device that stores or retrieves data or computer instructions, or any combination thereof.

One or more of the components, steps, features, and/or functions illustrated in FIGS. 5, 6, 7, 8, 9A-9C, 10, 11, 12, 13A-13C, 14 and/or 15 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs. The novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "die package" is used to refer to an integrated circuit wafer that has been encapsulated or packaged or encapsulated.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A die comprising:
   a substrate;
   at least one dielectric layer;
   a component; and
   a plurality of vias positioned at least partially around the component, wherein at least one via from the plurality of vias, comprises a ferromagnetic material.

2. The die of claim 1, wherein the component is sensitive to a magnetic field.

3. The die of claim 2, wherein the component is one of at least a transformer, a magnetoresistive random access (MRAM) cell, and/or a component comprising a magnetic material.

4. The die of claim 1, wherein at least one via from the plurality of vias, traverses at least the dielectric layer and/or the substrate of the die.

5. The die of claim 1, wherein the component is a magnetoresistive random access memory (MRAM) cell array comprising a plurality of MRAM cells.

6. The die of claim 5, wherein the plurality of vias is positioned laterally with respect to at least one MRAM cell.

7. The die of claim 1, further comprising a first ferromagnetic layer on a first portion of the die.

8. The die of claim 7, wherein the first ferromagnetic layer is a thin film layer coated on at least a front and/or a back portion of the die.

9. The die of claim 1, wherein the plurality of vias is coupled to a first ferromagnetic layer to define a magnetic shield for the component.

10. The die of claim 1, wherein the component comprises a magnetoresistive random access (MRAM) cell that includes a magnetic tunnel junction (MTJ).

11. The die of claim 1, wherein the ferromagnetic material has high permeability and high B saturation.

12. The die of claim 1, wherein the substrate comprises a material made of one of silicon, glass and/or sapphire.

13. The die of claim 1, wherein the die is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

14. A method for fabricating a die that includes a magnetic shield, comprising:
   providing a die that includes a substrate, at least one dielectric layer, and a component; and
   forming a plurality of vias positioned at least partially around the component, wherein at least one via from the plurality of vias, comprises a ferromagnetic material.

15. The method of claim 14, wherein the component is sensitive to a magnetic field.

16. The method of claim 15, wherein the component is one of at least a transformer, a magnetoresistive random access (MRAM) cell, and/or a component comprising a magnetic material.

17. The method of claim 14, wherein at least one via from the plurality of vias, traverses at least the dielectric layer and/or the substrate of the die.

18. The method of claim 14, wherein the component is a magnetoresistive random access memory (MRAM) cell array comprising a plurality of MRAM cells.

19. The method of claim 18, wherein the plurality of through substrate vias is positioned laterally with respect to at least one MRAM cell.

20. The method of claim 14, wherein the component comprises a magnetoresistive random access (MRAM) cell that includes a magnetic tunnel junction (MTJ).

21. A die comprising:
   a substrate;
   at least one dielectric layer;
   a component; and a first shielding means traversing the substrate and the at least one dielectric layer, the first shielding means configured to provide shielding of the component from a side magnetic field traversing a side portion of the die.

22. The die of claim 21, wherein the component is sensitive to a magnetic field.

23. The die of claim 22, wherein the component is one of at least a transformer, a magnetoresistive random access (MRAM) cell, and/or a component comprising a magnetic material.

24. The die of claim 21, wherein the component is a magnetoresistive random access memory (MRAM) cell array comprising a plurality of MRAM cells.

25. The die of claim 21, further comprising a second shielding means, different from the first shielding means, configured to provide shielding of the component from a magnetic field traversing one of at least a top portion and/or a bottom portion of the die.

26. The die of claim 21, wherein the component comprises a magnetoresistive random access (MRAM) cell that includes a magnetic tunnel junction (MTJ).

27. The die of claim 21, wherein the die is incorporated into at least one of a music player, a video player, an entertainment unit, a navigation device, a communications device, a mobile phone, a smartphone, a personal digital assistant, a fixed location terminal, a tablet computer, and/or a laptop computer.

28. A die package comprising:
a packaging substrate;
a die coupled to the packaging substrate;
a molding surrounding the die; and
a plurality of vias positioned at least partially around an outer perimeter of the die, the plurality of vias formed in at least the molding, wherein at least one via from the plurality of vias, comprises a ferromagnetic material.

29. The die package of claim 28, wherein the die comprises a component that is sensitive to a magnetic field.

30. The die package of claim 29, wherein the component is one of at least a transformer, a magnetoresistive random access (MRAM) cell, and/or a component comprising a magnetic material.

31. The die package of claim 28, further comprising a first ferromagnetic layer located at least one of below and/or above the die.

32. The die package of claim 31, wherein the first ferromagnetic layer forms an enclosure of the die package.

33. The die package of claim 28, wherein the die comprises a magnetoresistive random access memory (MRAM) cell array comprising a plurality of MRAM cell, the MRAM cell comprising a magnetic tunnel junction (MTJ).

34. The die package of claim 28, wherein the ferromagnetic material has high permeability and high B saturation.

35. The die package of claim 28, wherein the die package is incorporated into at least one of a music player, a video player, an entertainment unit, a navigation device, a communications device, a mobile phone, a smartphone, a personal digital assistant, a fixed location terminal, a tablet computer, and/or a laptop computer.

36. A method for providing a die package that includes a magnetic shield, comprising:
providing a packaging substrate;
providing a die coupled to the packaging substrate;
providing a molding surrounding the die; and
forming a plurality of vias positioned at least partially around an outer perimeter of the die, the plurality of vias formed in at least the molding, wherein at least one via from the plurality of vias, comprises a ferromagnetic material.

37. The method of claim 36, wherein the die comprises a component that is sensitive to a magnetic field.

38. The method of claim 37, wherein the component is one of at least a transformer, a magnetoresistive random access (MRAM) cell, and/or a component comprising a magnetic material.

39. The method of claim 36, further comprising forming a first ferromagnetic layer located at least one of below and/or above the die.

40. The method of claim 36, wherein the die comprises a magnetoresistive random access memory (MRAM) cell array comprising a plurality of MRAM cell, the MRAM cell comprising a magnetic tunnel junction (MTJ).

41. The method of claim 36, wherein the die package is incorporated into at least one of a music player, a video player, an entertainment unit, a navigation device, a communications device, a mobile phone, a smartphone, a personal digital assistant, a fixed location terminal, a tablet computer, and/or a laptop computer.

42. A die package comprising:
a packaging substrate;
a die coupled to the packaging substrate;
a molding surrounding the die; and
a first shielding means traversing the molding surrounding the die, the first shielding means configured to provide shielding of the die from a side magnetic field traversing a side portion of the die package.

43. The die package of claim 42, wherein the die comprises a component that is sensitive to a magnetic field.

44. The die package of claim 43, wherein the component is one of at least a transformer, a magnetoresistive random access (MRAM) cell, and/or a component comprising a magnetic material.

45. The die package of claim 42, wherein the die package further comprises a second shielding means, different from the first shielding means, configured to provide shielding of the die from a magnetic field traversing one of at least a top portion and/or a bottom portion of the die package.

46. The die package of claim 42, wherein the die comprises a magnetoresistive random access memory (MRAM) cell array comprising a plurality of MRAM cell, the MRAM cell comprising a magnetic tunnel junction (MTJ).

47. The die package of claim 42, wherein the die package is incorporated into at least one of a music player, a video player, an entertainment unit, a navigation device, a communications device, a mobile phone, a smartphone, a personal digital assistant, a fixed location terminal, a tablet computer, and/or a laptop computer.

* * * * *